United States Patent
Takada et al.

(10) Patent No.: US 6,541,693 B2
(45) Date of Patent: *Apr. 1, 2003

(54) SOLAR CELL MODULE AND PROCESS FOR ITS PRODUCTION, AND SOLAR CELL MODULE INSTALLING METHOD AND SOLAR ELECTRICITY GENERATION SYSTEM

(75) Inventors: Takeshi Takada, Kyotanabe (JP); Akiharu Takabayashi, Nara (JP); Masahiro Mori, Kyoto (JP); Ayako Komori, Joyo (JP); Masaaki Matsushita, Kyotanabe (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,701

(22) Filed: Jan. 19, 1999

(65) Prior Publication Data
US 2001/0045228 A1 Nov. 29, 2001

(30) Foreign Application Priority Data
Jan. 21, 1998 (JP) .......................................... 10-009418

(51) Int. Cl.[7] ............................................ H01L 31/042
(52) U.S. Cl. ...................... 136/244; 136/251; 136/258; 136/252; 136/256; 136/259; 136/290; 136/291; 136/245; 52/173.3; 126/621; 126/623; 126/622; 126/624; 438/57; 438/64; 438/96; 60/641.8
(58) Field of Search ................................ 136/244, 251, 136/258 PC, 252, 256, 245, 258 AM, 259, 290, 291; 52/173.3; 126/621, 623, 622, 624; 257/53, 433; 438/57, 64, 96; 60/641.8

(56) References Cited

U.S. PATENT DOCUMENTS 5,069,727 A * 12/1991 Kouzuma et al. ........... 136/259
5,650,363 A * 7/1997 Endroes et al. ............. 136/259

FOREIGN PATENT DOCUMENTS

| JP | 4-266069 | * | 9/1992 |
| JP | 06-005769 | | 1/1994 |
| JP | 07-302924 | | 11/1995 |
| JP | 08-222752 | | 8/1996 |
| JP | 8-222752 | * | 8/1996 |
| JP | 08-222753 | | 8/1996 |

OTHER PUBLICATIONS

K. Nakatani et al., "Electrical properties of hydrogenated amorphous silicon layers on a polymer film substrate under tensile stress," *Appl. Phys. Lett.*, vol. 54, No. 17 pp. 1678–1680, Apr. 1989.

M. Utsunomiya et al., "Effect of mechanical strain on electrical characteristics of hydrogenated amorphous silicon junctions," *J. Appl. Phys.*, vol. 66, No. 1 pp. 308–311, Jul. 1989.

* cited by examiner

*Primary Examiner*—Alan Diamond
(74) *Attorney, Agent, or Firm*—Fitzpatrick, Cella, Harper & Scinto

(57) ABSTRACT

A solar cell module comprises a photovoltaic device having a flexible substrate. The photovoltaic device has a strain at least partly in the planar direction of the flexible substrate, and the strain is not greater than a critical value at which the photovoltaic device cracks. The solar cell module may further comprise a strain holding means for holding the strain. A deformable region where the photovoltaic device can be deformed when a region embracing the photovoltaic device is worked is defined so that a great variety of solar cell modules having a high reliability, also taking account of manufacture, can be designed with good efficiency.

63 Claims, 11 Drawing Sheets

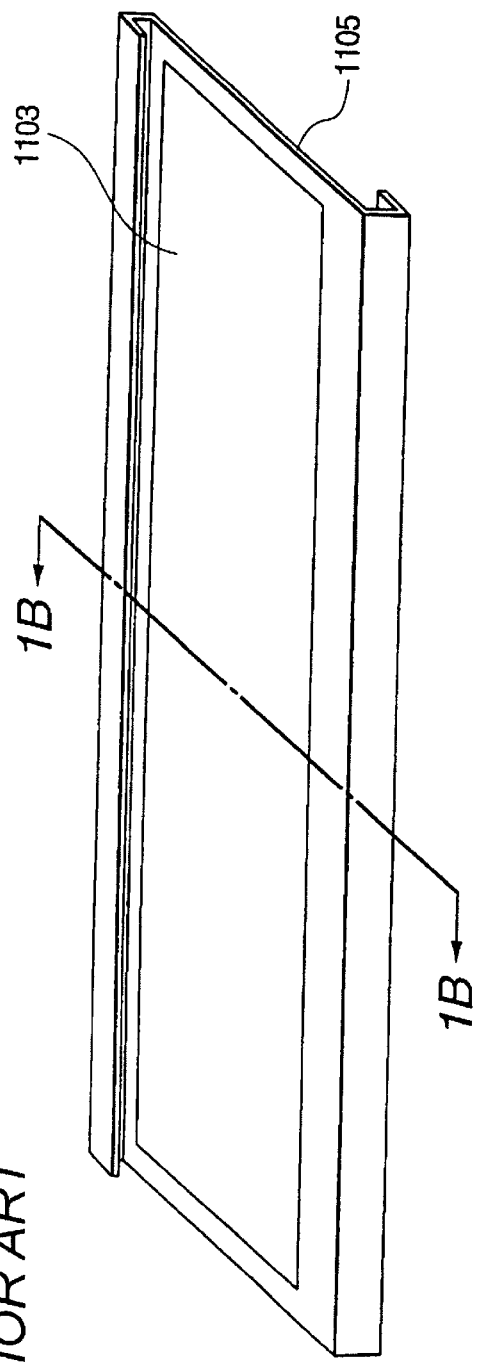
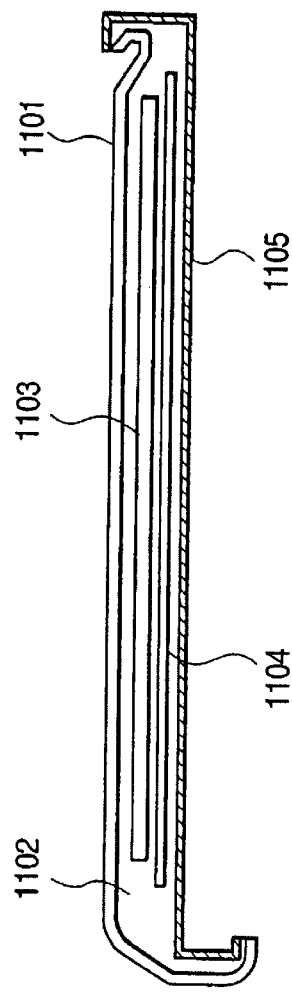
FIG. 1A
PRIOR ART
FIG. 1B
PRIOR ART

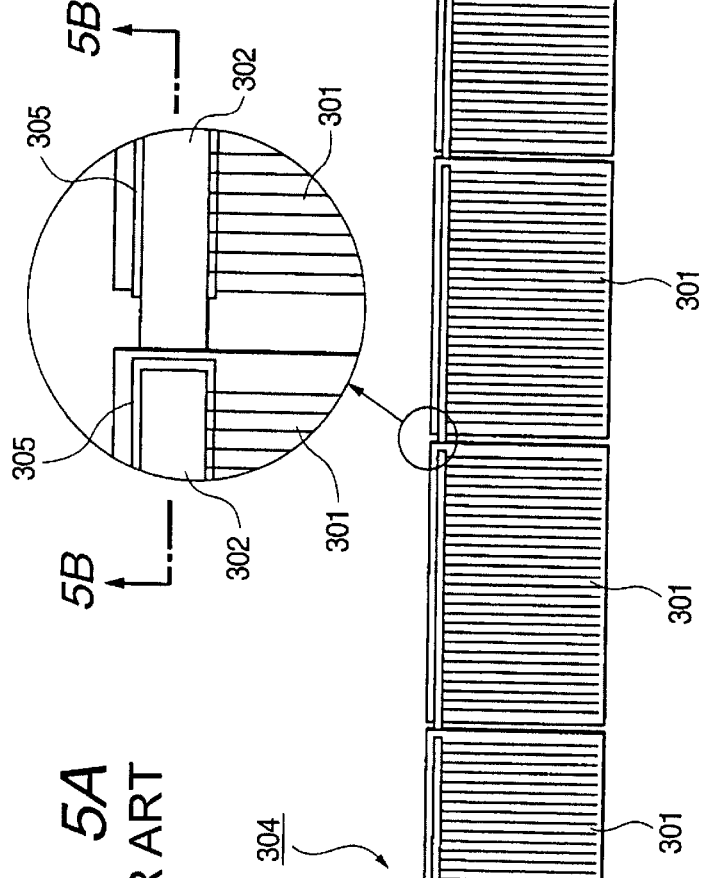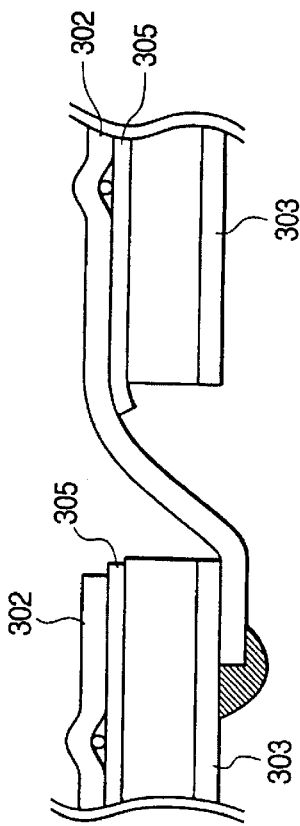
FIG. 5A PRIOR ART
FIG. 5B PRIOR ART

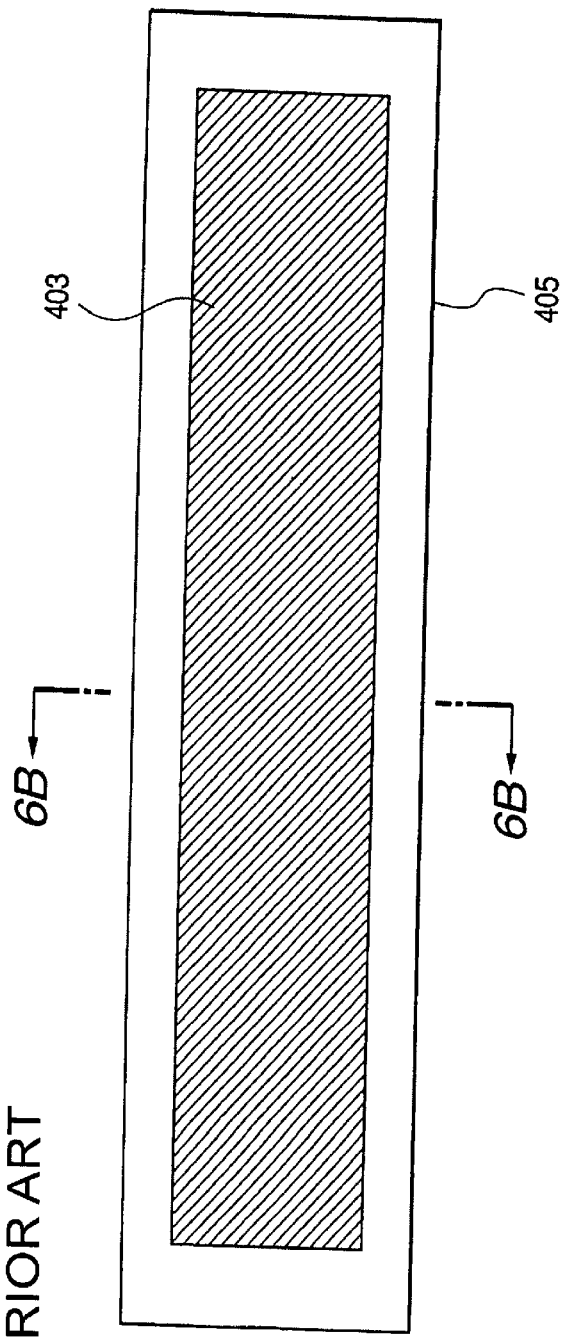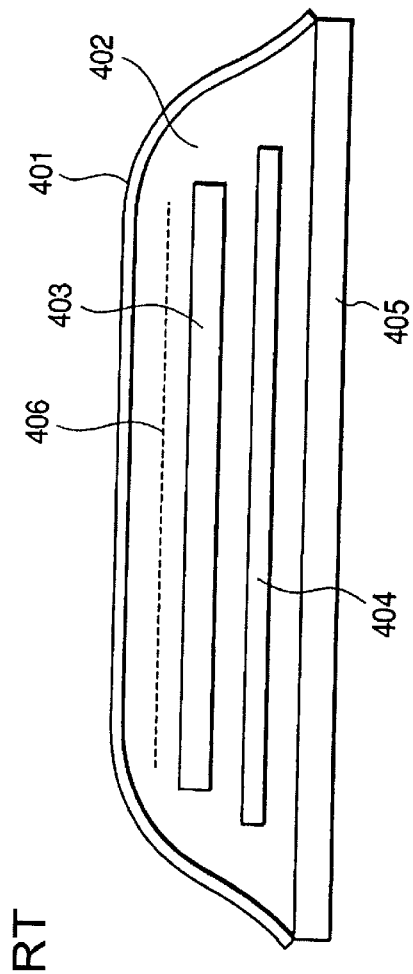
FIG. 6A PRIOR ART
FIG. 6B PRIOR ART

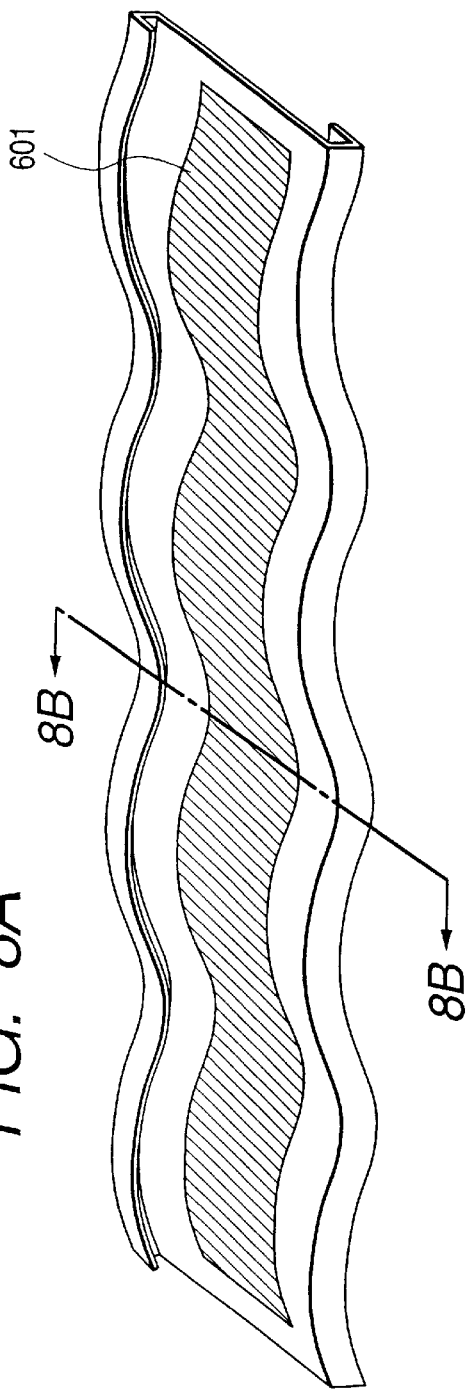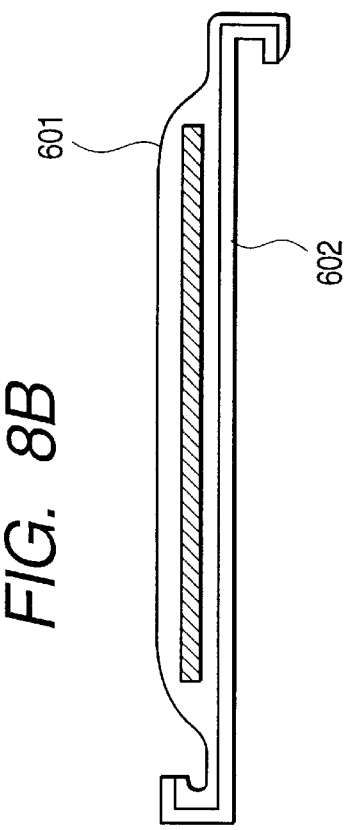

SOLAR CELL MODULE AND PROCESS FOR ITS PRODUCTION, AND SOLAR CELL MODULE INSTALLING METHOD AND SOLAR ELECTRICITY GENERATION SYSTEM

BACKGROUND OF THE INVENTION

1. Field of the Invention

This invention relates to a solar cell module and a process for its production, and more particularly to a solar cell module having a high reliability, which can have a great variety of shapes given by working its regions embracing photovoltaic devices. This invention also relates to a solar cell module installing method and a solar electricity generation system which make use of the solar cell module.

2. Related Background Art

In recent years, an increase in conceousness about energy source protection and environmental problems is spreading worldwide. In particular, people have a serious anxiety about the exhaustion of oil and the phenomenon that $CO_2$ emissions make the earth's environment warm. Accordingly, solar cell energy, produced by converting solar energy directly to electric power and being a clean energy, are considered greatly hopeful.

Solar cells presently in use have various types including those making use of crystalline silicon and those making use of amorphous silicon.

In particular, amorphous silicon solar cells comprising a conductive metal substrate and a transparent conductive layer formed thereon are more inexpensive and light-weight than solar cells making use of crystalline silicon solar cells and also are rich in impact resistance and flexibility, thus they are considered promising. Recently, they are installed on roofs, walls and so forth of buildings, making the most of the advantages that they are light-weight, have a superior impact resistance and are flexible, which are characteristic features of the amorphous silicon solar cells. In such an instance, reinforcing materials are laminated to solar cells on their non-light-receiving sides via adhesives or the like so that they can also be used as construction materials. Laminating reinforcing materials in this way can make solar cell modules have a higher mechanical strength and can prevent them from warping or deforming because of temperature changes. Especially, since more sunlight can be taken in, it is done positively to install such solar cell modules on roofs. When used on roofs, in conventional steps, frames are attached to solar cells, a stand is set on a roof and the solar cells are further set on the stand. In contrast to such procedure, solar cell modules provided laminately with reinforcing materials can be set directly as roofing materials, the reinforcing materials being worked by bending. Thus, since material cost can be cut down greatly and the number of operation steps can also be lessened greatly, it becomes possible to provide inexpensive solar cell modules. Also, since it is unnecessary to provide frames and stands, a very light-weight solar cell set can be set up. More specifically, such a solar cell set can be dealt as a metal roof which attracts notice recently because of its superior installation operability, light weight and superior earthquake resistance.

For example, a roofing material integral type solar cell module disclosed in Japanese Patent Application Laid-Open No. 7-302924 is worked in the same way as roofing materials usually available, and hence can be installed in a good operability. When it is worked, molding machines used conventionally can be used as they are, can be handled with ease and are available at a low cost. However, in this solar cell module, photovoltaic devices are positioned at a flat area of a flat panel lateral roofing material, and the photovoltaic devices are not deformed at all in structure.

In order for the roofing material integral type solar cell module to be light-weight and so formed as to be able to be worked in the same way as usual roofing materials, the module may preferably be formed in such a way that amorphous silicon semiconductors are sealed insulatingly with a resin on a steel sheet used conventionally as a roofing material.

FIGS. 1A and 1B are a plan view and a cross-sectional view, respectively, which illustrate diagrammatically an example of a solar cell module. In FIGS. 1A and 1B, reference numeral 1101 denotes a surface protective material; 1102, a filler; 1103, a photovoltaic device; 1104, a back protective material; and 1105, a reinforcing material.

Recently, there is a tendency of attaching importance to individual originality, and construction materials and solar cells are no exception to such tendency. In order to continue to prepare solar cells and construction materials having a great variety of shapes adapted to various needs, what is necessary is not to always keep the region of a photovoltaic device flat but to ensure workability at all regions embracing the photovoltaic device.

As an example adaptable to such a variety, Japanese Patent Application Laid-Open Nos. 8-222752 and 8-222753 and Japanese Patent Publication No. 6-5769 disclose corrugated solar cell modules. In all publications, an example is shown in which photovoltaic devices are arranged in the form of waves so that light can be utilized in an improved efficiency. The photovoltaic devices are, e.g., bonded with an adhesive to a steel sheet worked into a corrugated sheet.

In the above example, however, the stress that applies to photovoltaic devices is not taken into account when the photovoltaic devices are worked into waves. More specifically, all the amount of deformation in a substrate, the amount of deformation in a photovoltaic device and the amount of deformation as a solar cell module are not taken into account. The publications also do not refer at all to any influence of stress or deformation applied and any reliability against these.

Incidentally, the relationship between an a-Si:H (hydrogenerated amorphous silicon) layer and its strain is reported in, App. Phys. Lett. 54(17), 1989, pp.1678–1680, "Electrical Properties of Hydrogenerated Amorphous Silicon Layers on Polymer Film Substrate under Tensile Stress". In this publication, reported is a change in resistance in a dark state when an a-Si:H layer (0.5 $\mu$m thick, composed chiefly of i-type a-Si:H) is formed superposingly on a PET (polyethylene terephthalate) substrate (100 $\mu$m thick) and the a-Si:H layer is tensed. Details of this report are as follows: When the a-Si:H layer is tensed, the resistance becomes gradually higher (reversible) until 7,000 $\mu\epsilon$ (elongation of 0.7%) because of the piezoelectric effect, and the resistance increases abruptly (irreversible) above 7,000 $\mu\epsilon$ because weak Si—Si bonds are cut off. It, however, is reported that the a-Si:H layer having increased in resistance as a result of the straining to above 7,000 $\mu\epsilon$ returns to the original state upon annealing at 150° C. for 1 hour.

Nevertheless, this report neither discloses nor suggests that photovoltaic devices having been strained are put into use or that photovoltaic devices are made into a module in the state the devices have been strained. In addition, it concerns no evaluation at all on the reliability of the solar cell module whose photovoltaic devices have been strained.

J. App. Phys. 66(1), 1989, pp.308–311, "Effect of Mechanical Strain on Electrical Characteristics of Hydrogenated Amorphous Silicon Junctions" also reports a piezoelectric effect of a-Si:H having p-i-n junction. Details of this report are as follows: When a-Si:H having p-i-n junction is strained in parallel to the p-i-n junction, electric currents decrease by 8% in both the forward direction and the backward direction (a dark state). Also, electric currents increase by 8% under application of a compression stress of 7,500 $\mu\varepsilon$.

Since, however, at any event the reliability in use of photovoltaic devices having been strained is unclear, it has been avoided to work photovoltaic devices by applying stress or deformation thereto to prepare solar cell modules. Even if worked into a shape, their reliability in such shape must always be examined continually. In usual instances, many reliability tests must be made on one product (on its shape and strain after working), and hence it takes a very long time to bring one product into a finished product. More specifically, such a manner can not be expected to enable manufacture at the speed adaptable to the present demand for solar cells and construction materials which are sought to be available as a great variety of products.

SUMMARY OF THE INVENTION

The present invention has been made taking account of the above problems. An object of the present invention is to provide a solar cell module and a solar electricity generation system which have a high reliability over a long period of time.

Another object of the present invention is to provide a solar cell module that can give a superior beauty and design.

In addition, an object of the present invention is to provide a sollar cell module with an excellent workability.

Still another object of the present invention is to provide a solar cell module that can be installed with ease and can enjoy a low cost.

A further object of the present invention is to provide a solar cell module installing method and a solar electricity generation system that are rich in reliability, can be installed well and can enjoy a low cost, which make use of such a solar cell module.

A still further object of the present invention is to provide a process for producing a solar cell module which can achieve the above objects.

To achieve the above objects, the present invention provides a solar cell module comprising a photovoltaic device having a flexible substrate, wherein the photovoltaic device has a strain at least partly in the planar direction of the flexible substrate, and the strain is set not more than a critical value at which the photovoltaic device cracks; and provides a method of installing such a solar cell module by the use of a fixing member, and a solar electricity generation system having the solar cell module.

The present invention also provides a process for producing a solar cell module comprising a photovoltaic device having a flexible substrate, which process comprises a working step of causing the photovoltaic device to have a strain at least partly in the planar direction of the flexible substrate; the strain being set not more than a critical value at which the photovoltaic device cracks.

BRIEF DESCRIPTION OF THE DRAWINGS

FIG. 1A is a diagrammatic perspective view to illustrate an example of a solar cell module, and FIG. 1B is a diagrammatic cross-sectional view along the line 1B—1B in FIG. 1A.

FIG. 5A is a diagrammatic plan view of a solar cell module at the stage of a cell block comprising photovoltaic devices connected in plurality (the view in a circle is an enlarged view), and FIG. 5B is a diagrammatic cross-sectional view along the line 5B—5B in the enlarged view, showing a part where some photovoltaic devices shown in FIG. 5A are connected.

FIG. 6A is a diagrammatic plan view to show an example of a solar cell module, and FIG. 6B is a diagrammatic cross-sectional view along the line 6B—6B in FIG. 6A.

FIG. 7A, FIG. 8A and FIG. 10A are diagrammatic perspective views to show examples of solar cell modules, and FIG. 7B, FIG. 8B and FIG. 10B are diagrammatic cross-sectional views along the lines 7B—7B, 8B—8B and 10B—10B in FIGS. 7A, 8A and 10A, respectively. In FIG. 10B, the view in a circle is an enlarged view.

DESCRIPTION OF THE PREFERRED EMBODIMENTS

Figure 2A:
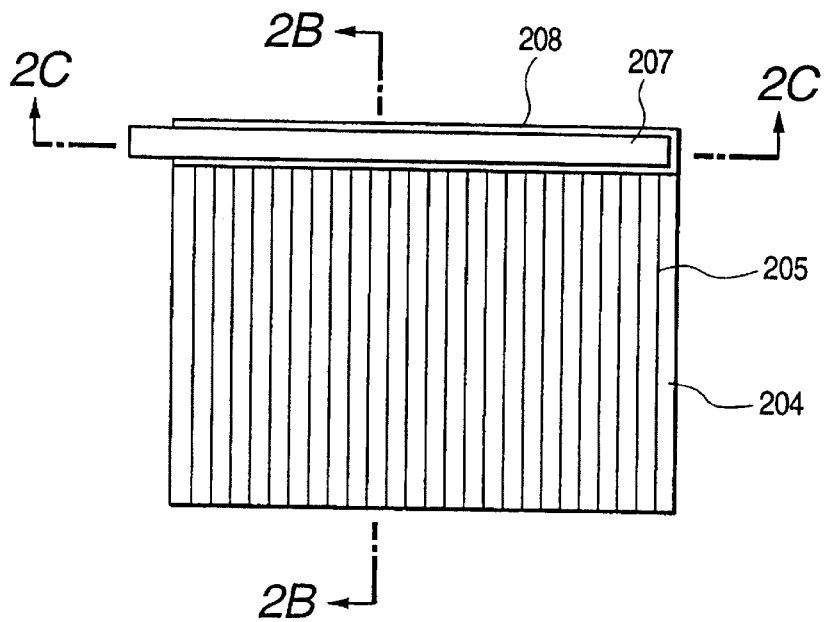
FIG. 2A is a diagrammatic plan view to illustrate an example of a photovoltaic device.

In the present invention, the stress applied to photovoltaic devices is taken into account, and the solar cell module is produced taking account of it.

In order to manufacture a great variety of highly reliable solar cell modules more speedily, it is necessary to take, e.g., the following points into consideration.
(1) To clarify or define the deformable region of a photovoltaic device, when a region embracing the photovoltaic device is worked.
(2) To ensure long-term reliability after the photovoltaic device has been deformed.

The solar cell module of the present invention embraces, e.g., the following embodiments and can be remarkably effective as stated below.

(1) The solar cell module of the present invention has a photovoltaic device provided on a flexible substrate, wherein (i) the photovoltaic device has a strain at least partly in the planar direction of the flexible substrate, (ii) the strain is set not more than a critical value at which the photovoltaic device cracks (hereinafter often "cracking critical value"), and optionally (iii) the solar cell module may have a strain holding means for holding the strain. Thus, the deformable region of the photovoltaic device can be defined and hence a great variety of solar cell modules can be developed at a greatly higher speed. Also, the solar cell module can be worked without impairing electrical properties of the solar cell module. This makes it possible to work the module freely to deform also in the region of the photovoltaic device, and hence to obtain a solar cell module that can give a superior beauty and design. The solar cell module having been worked can also be a highly reliable solar cell module. Since also it may have a strain holding means, the shape and strain given by working can be retained also after the working and a solar cell module can be obtained which is superior in both beauty and design.

(2) The strain may be a strain in the tensile direction. The deformation applied by working to the photovoltaic device includes a strain in the tensile direction and a strain in the compression direction. In a preferred embodiment, the present invention is concerned with cracks produced when deformed by a strain applied in the tensile direction, and can be more effective within that scope.

(3) The strain holding means is to cause the flexible substrate to undergo plastic deformation. Thus, it is unnecessary to provide any additional member as a strain holding means and enables work-formation of solar cell modules at a low cost.

(4) The solar cell module may have a reinforcing material, and the strain holding means may be to cause the reinforcing material to undergo plastic deformation. This can provide a construction material integral type solar cell module when the reinforcing material is provided on the non-light-receiving side of the solar cell module, and also can improve installation operability for the solar cell module, thus a low-cost solar electricity generation system can be set up. The reinforcing material may also be used as the strain holding means. This makes it unnecessary to provide any additional member as a strain holding means and enables work-formation of solar cell modules at a much low cost.

(5) The photovoltaic device may have a light-activated layer, and the light-activated layer may be a non-single-crystal semiconductor. This makes it possible to work the reinforcing material without regard to whether or not the photovoltaic device lies there, since both the flexible substrate and the light-activated layer have a flexibility. Thus, solar cell modules can be worked in variety.

(6) The flexible substrate may be a conductive substrate, thus the substrate can serve as the cathode of the photovoltaic device, making it easy to lead out electrodes.

(7) The conductive substrate may be formed of stainless steel, thus the substrate can have so high a corrosion resistance that a highly reliable solar cell module can be set up without causing corrosion or oxidation also when the substrate is covered with a high-polymer resin.

(8) The flexible substrate may be formed of a resin film, thus an inexpensive solar cell module can be set up and also, because of its very rich flexibility, a solar cell module much improved in workability can be obtained.

(9) The reinforcing material may comprise a metal, thus a solar cell module having superior weatherability and wear resistance can be set up. Also, because of a flexible reinforcing material, it can be worked well.

(10) The solar cell module may have a surface protective material, and the surface protective material may comprise a transparent resin film. Thus, a light-weight solar cell module can be set up, bringing about an improvement in earthquake resistance of houses when used as roofing materials. Since also a solar cell module having a flexibility can be set up, it can have an improved design and workability. In addition, the module can be prevented from external contamination during long-term outdoor exposure to cause less decrease in conversion efficiency of the solar cell module.

(11) The solar cell module may have a filler, and the filler may comprise an organic-high-polymer resin, thus a solar cell module having a flexibility can be set up while making the most of the flexibility the photovoltaic device has.

(12) The solar cell module may have a back protective material, and the back protective material may comprise a transparent resin film. The back protective material has the function to keep insulation between the photovoltaic device and the reinforcing material. Usually, it constitutes the solar cell module in a size a little larger than the photovoltaic device. Hence, the back protective material is so disposed as to protrude from the periphery of the photovoltaic device when the solar cell module is viewed on the light-receiving side. When it is a transparent material, it has the effect of not damaging the visual appearance required as solar cell modules.

(13) The critical value at which the photovoltaic device cracks may be 4,500 $\mu\epsilon$. Thus, in a non-single-crystal photovoltaic device, it is possible to define a cracking-free displacement region where the photovoltaic device can be deformed.

(14) The plastic deformation of the flexible substrate may be a tensile deformation of 2,000 $\mu\epsilon$ or more, thus the substrate can undergo plastic deformation at a small strain, and hence the photovoltaic device can be worked without damaging its semiconductor light-activated layer.

(15) The reinforcing material may be caused to undergo plastic deformation at its area not embracing the photovoltaic device, thus the module can be deformed greatly as a solar cell module while controlling the strain to the photovoltaic device so as to be not more than the cracking critical value, making it possible to set up a great variety of products.

(16) The solar cell module may be a construction material integral type solar cell module. Thus, compared with conventional types in which solar cell modules are set on a construction material, a lower-cost solar cell module can be set up because the construction material is unnecessary. Moreover, its installation on roofs or walls of buildings enables effective utilization of installation places, making it possible to generate electricity in a good efficiency. Such solar cell modules may be connected with an electric power conversion equipment to make up a solar electricity generation system.

In order to solve the problems discussed previously, the present inventors have made researches and development on techniques of how to work photovoltaic devices. Experiments made therefor are as reported below.

[Experiment 1]

This experiment intends to examine strains and changes in characteristics when photovoltaic devices are deformed at various strains.

First, samples used in Experiment 1 will be described with reference to FIGS. 2A to 2C.

Figure 2B:
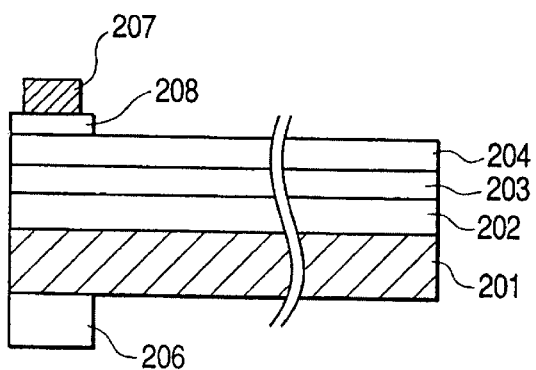
FIGS. 2B and 2C are diagrammatic cross-sectional views along the lines 2B—2B and 2C—2C, respectively, in FIG. 2A.
Figure 2C:
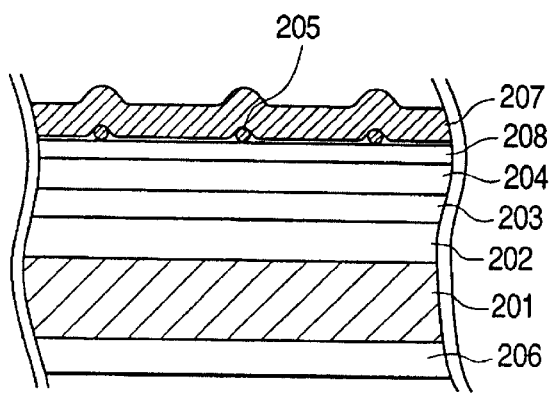

FIGS. 2A to 2C are a diagrammatic plan view and diagrammatic cross-sectional views to show an example of the samples of photovoltaic devices used in Experiment 1.

(Preparation of photovoltaic device)

A flexible substrate 201 was a cleaned stainless steel sheet. On the flexible substrate 201, an Al layer (layer thickness: 1,000 Å) and a ZnO layer (layer thickness: 1,200 Å) were formed as a back reflection layer 202 by sputtering. Subsequently, as a light-activated layer 203, a tandem type a-Si (amorphous silicon) light-activated layer was formed by forming n-type a-Si layers, i-type a-Si layers and p-type uc-Si (microcrystalline silicon) layers using a mixed gas of $SiH_4$, $PH_3$ and $H_2$, a mixed gas of $SiH_4$ and $H_2$ and a mixed gas of $SiH_4$, $BF_3$ and $H_2$, respectively, by plasma CVD (chemical vapor deposition) in layer configuration of 150 Å thick n-type layer/4,000 Å thick i-type layer/100 Å thick p-type layer/100 Å thick n-type layer/800 Å thick i-type layer/100 Å thick p-type layer. Next, as a transparent conductive layer 204, an $In_2O_3$ thin film (layer thickness: 700 Å) was formed by vacuum-depositing indium in an atmosphere of $O_2$ by resistance heating. As a collector electrode 205, a wire grid was further formed by contact-bonding carbon-coated wires with heating. Finally, as a negative-pole output terminal 206, a copper tab was soldered to the stainless steel substrate, and as a positive-pole output terminal 207 a silver-clad copper foil was attached to the collector electrode 205 by its heat contact bonding on the collector electrode 205. An insulating material 208 was also provided beneath the positive-pole output terminal 207. The insulating material 208 was a double-coated polyimide tape, bonding the positive-pole output terminal 207 to the transparent conductive layer 204. Thus, a photovoltaic device was obtained.

Experiment 1 was made in the manner described below. First, a strain gauge was attached to the substrate of the photovoltaic device on its non-light-receiving side. Thereafter, initial characteristics were measured. This sample was put on a tensile tester to apply stress (strain) in the direction where the photovoltaic device was made tense (the direction it was stretched) in the horizontal direction of the substrate. In this instance, peak strain was measured at each strain until the substrate reached a strain of 12,000 $\mu\epsilon$ (1.2% elongation). In this way, characteristics of the sample changed under strain were again measured, and finally the surface of the photovoltaic device was observed by SEM (scanning electron microscopy).

Figure 3:
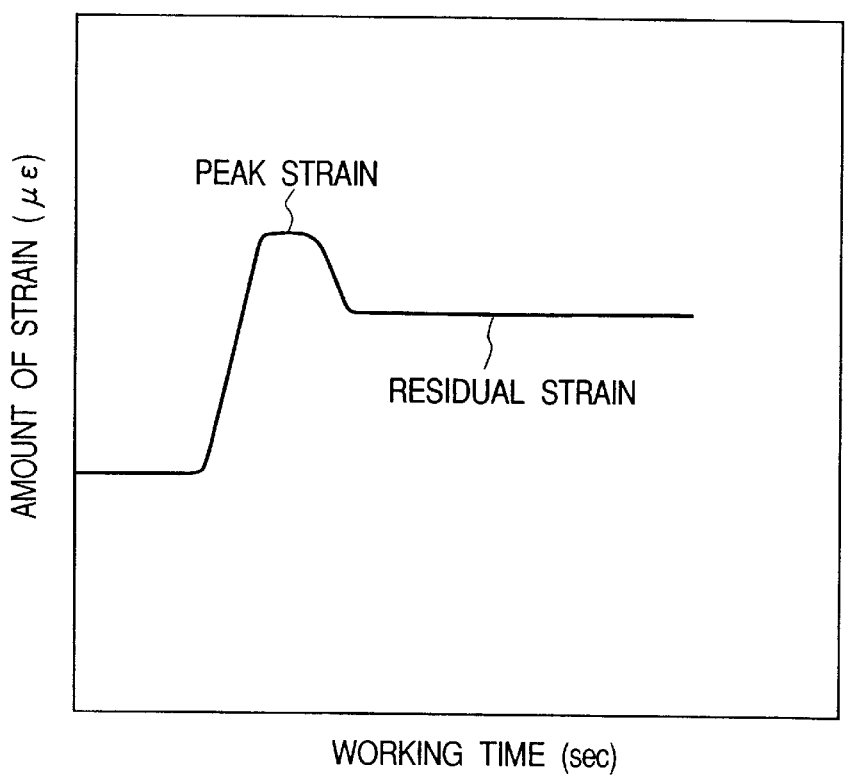
FIG. 3 is a graph showing an example of changes in strain with time, of a photovoltaic device.

The results of Experiment 1 are reported below. The peak strain will be explained in the first place. FIG. 3 is a graph showing an example of changes in strain with time, of a photovoltaic device. Working time (sec) is plotted as abscissa, and the amount of strain ($\mu\epsilon$) as ordinate. How the photovoltaic device stands deformed is indicated as changes with time. When the amount of strain is a positive value, it is in the tensile direction, and the deformation of the photovoltaic device is also due to a strain in the tensile direction. As can be seen from FIG. 3, the strain is grouped into two types, a peak strain produced at the stage of tension and a residual strain remaining at the time the tension is stopped. If defects such as cracks have occurred in the light-activated layer at the point of a peak strain produced at the stage of tension and even if the residual strain has completely been eliminated thereafter, it does not follow that the layer is restored to the original defects-free state. Accordingly, the peak strain is important when the relationship between the deformable region of a photovoltaic device and the strain is described.

F.F. (fill factor) will be explained below which is a factor indicating electrical properties of the photovoltaic device. This is expressed by F.F.=maximum electric power (Pm)/ [(short-circuit current (Isc)×open-circuit voltage (Voc)]. More specifically, as a physical meaning, this is the value obtained by comparing an electric power Pm that can be taken out actually, with the product of the Voc which is the value obtained when only voltage is taken out at maximum and the Isc which is the value obtained when only electric current is drawn out at maximum. Practical F.F. value depends on forward-direction characteristics of a p-n junction, and hence the F.F. drops when a leakage current flows through defects included in the light-activated layer used or defects caused when the p-n junction is formed or in the subsequent production steps, resulting in a decrease in the output that should have been delivered originally. What this means is that the F.F. having dropped after a tensile test indicates that defects have occurred in the light-activated layer as a result of the tensile test.

Next, peak strains and changes in F.F. of photovoltaic devices deformed by such strains are graphed, and F.F.-drop critical values are defined therefrom.

Figure 4:
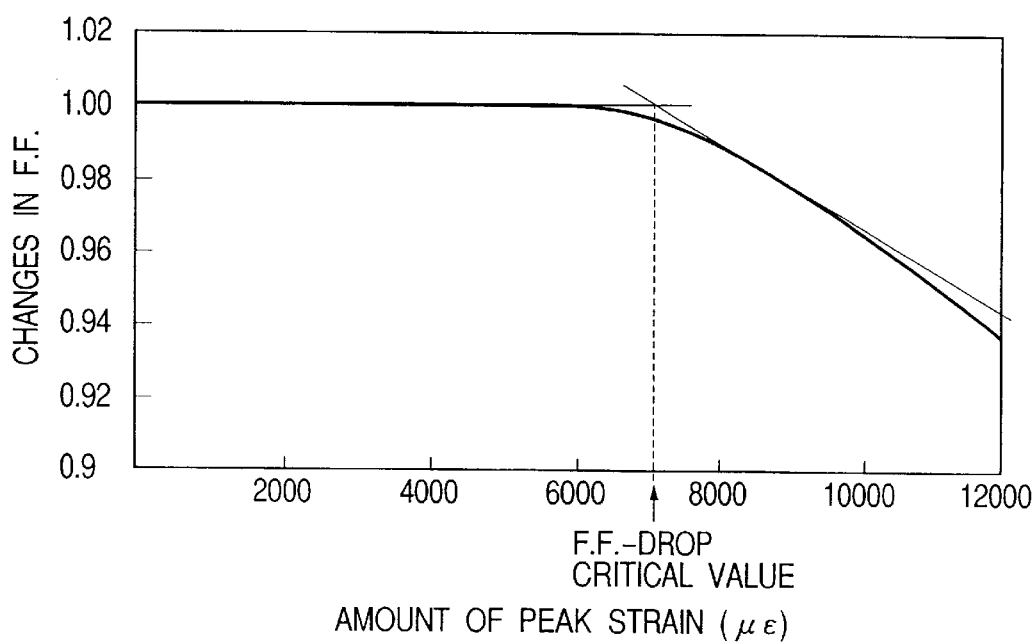
FIG. 4 is a graph showing an example of the relationship between peak strain and F.F. (fill factor).

FIG. 4 is a graph showing the relationship between peak strain and rate of change in F.F. According to this graph, photovoltaic devices cause a drop of F.F. from a certain point of strain. This drop of F.F. forms a gentle curve. Accordingly, the point at which two tangent lines drawn as shown in FIG. 4 intersect is defined as the F.F.-drop critical value. In the case shown in FIG. 4, the intersecting point of the two tangent lines is at 7,000 $\mu\epsilon$ (0.7% strain). That is, the F.F. is found to drop when the peak strain becomes 7,000 $\mu\epsilon$ or more. Thus, when photovoltaic devices are worked, in order to prevent their electrical properties from lowering, the peak strain applied to a photovoltaic device when worked may preferably be less than the F.F.-drop critical value.

Finally, light-activated layers of the photovoltaic devices were observed by SEM. In this experiment, in a photovoltaic device having a strain of F.F.-drop critical value or more, cracks were seen in the light-activated layer a-Si:H semiconductor.

As can be seen from the foregoing, when a strain of F.F.-drop critical value or more is applied to a photovoltaic device, i.e., when a photovoltaic device making use of a-Si:H in the light-activated layer is deformed at a peak strain of 7,000 $\mu\epsilon$ or more, cracks occur in the photovoltaic device.

[Experiment 2]

This experiment intends to examine the reliability of photovoltaic devices having strain, when set up as actual solar cell modules.

Various reliability tests were made on solar cell modules comprising photovoltaic devices having various strain.

First, how to prepare samples used will be described with reference to FIGS. 5A and 5B.

(Preparation of cell block)

FIGS. 5A and 5B are a diagrammatic plan view and a diagrammatic cross-sectional view, respectively, of a sample at the stage of a cell block, used in Experiment 2. A process for producing a solar cell block will be described with reference to FIGS. 5A and 5B; the cell block comprising the photovoltaic device used in Experiment 1, in which five photovoltaic devices were connected in series.

The five photovoltaic devices were arranged in a rank. Thereafter, a positive-pole output terminal 302 of one photovoltaic device 301 of photovoltaic devices 301 adjoining to each other and a negative-pole output terminal 303 of the other photovoltaic device 301 are connected by soldering. The positive-pole output terminal 302 was beforehand made long so as to be connectable. An insulating material 305 was also provided beneath the positive-pole output terminal 302. Thus, the five photovoltaic devices were connected in series to form a cell block 304. The positive-pole and negative-pole output terminals 302 and 303 provided respectively at both ends of each photovoltaic device 301 were wired (not shown) to the back (the non-light-receiving side) of the cell block 304. Thus, a solar cell block was prepared.

(Preparation of module)

FIGS. 6A and 6B are a diagrammatic plan view and a diagrammatic cross-sectional view, respectively, of an example of a solar cell module at the stage of a flat module, as a sample used in Experiment 2. In FIGS. 6A and 6B, reference numeral 401 denotes a surface protective material; 402, a filler; 403, a photovoltaic device cell block; 404, a back protective material; and 405, a reinforcing sheet. Stated more specifically, as the surface protective material 401, ETFE (ethylene-tetrafluoroethylene copolymer) was used; and as the filler 402, EVA (ethylene-vinyl acetate copolymer). Taking account of being scratched from the outside, the filler on the light-receiving side was impregnated with a surface-protection reinforcing material 406. As the surface-protection reinforcing material 406, specifically stated, glass nonwoven fabric was used. As the back protective material 404, a PET (polyethylene terephthalate) film was used. As the reinforcing sheet, a painted zinc-coated steel sheet was used.

Incidentally, taking account of visual appearance, a decorative tape may preferably be laminated to the surfaces of the positive-pole output terminals of the photovoltaic device cell block 403.

These were superposed in the order of an integral laminate consisting of the reinforcing sheet 405, the back protective material 404 and the back-side filler 402 and an integral laminate consisting of the photovoltaic device cell block 403, the surface-protection reinforcing material 406, the filler 402 and the surface protective material 401, which are then heated in vacuum by means of a single-layer vacuum type laminator, thus a flat solar cell module was prepared. Here, as vacuum conditions, the evacuation was made at an evacuation rate of 76 Torr/sec and at a degree of vacuum of 5 Torr for 30 minutes. Thereafter, the laminator was put into a 160° C. hot-air oven, and was heated for 50 minutes. Here, the EVA was placed in an environment of 140° C. or above for 15 minutes or longer. This caused the EVA to melt and become cross-linked. Thus, a flat type solar cell module was prepared.

Holes were made previously in the reinforcing sheet 405 at its parts corresponding to the positive-pole and negative-pole output terminals of the photovoltaic device cell block 403 so that the positive-pole and negative-pole output terminals could be lead out (not shown).

(Working by roller former)

Figure 7A:
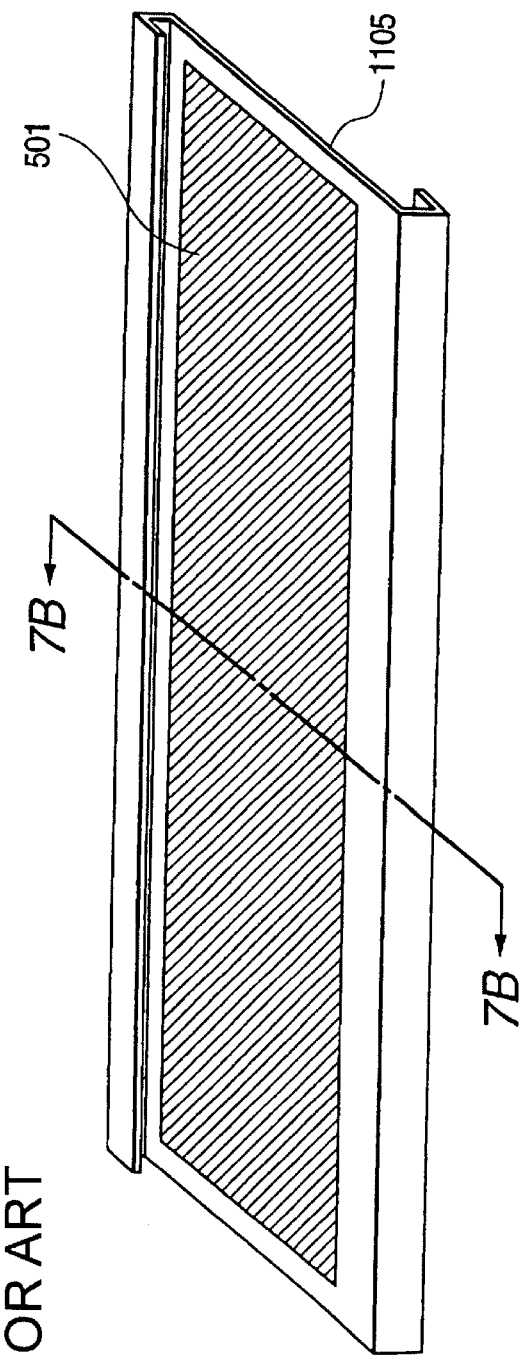
Figure 7B:
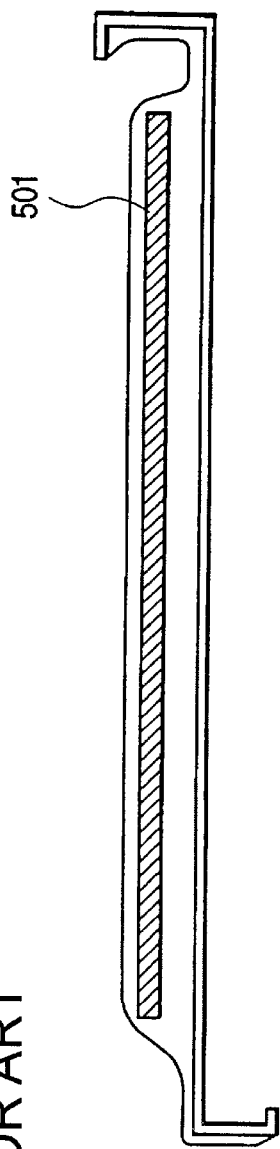

FIGS. 7A and 7B are a diagrammatic perspective view and a diagrammatic cross-sectional view, respectively, of an example of a solar cell module in the course of working, as a sample used in Experiment 2. Edges of the solar cell module were worked by bending as shown in FIGS. 7A and 7B. At this stage, the part of the photovoltaic device cell block, 501, was not worked, and the edges were so worked that the roller did not come into touch with the photovoltaic device cell block 501.

(Pressing)

FIGS. 8A and 8B are a diagrammatic perspective view and a diagrammatic cross-sectional view, respectively, of an example of a solar cell module having a finished form, as a sample used in Experiment 2. The solar cell module was worked as shown in FIGS. 8A and 8B by means of a press molding machine. At this stage, the reinforcing sheet, 602, was worked by bending without regard to whether or not the photovoltaic device cell block, 601, lay there. The working by pressing was carried out in such a way that the solar cell module was held between a bottom force having convexes and a top force having concaves.

The strain applied to the photovoltaic device cell block 601 can be changed by changing working conditions. Thus, samples having various strain were prepared.

Table 1 shows a summary of the samples used in Experiment 2.

TABLE 1

| Sample No. | Peak strain ($\mu\epsilon$) | Residual strain ($\mu\epsilon$) |
|---|---|---|
| Sample 1 | 6,000 | 4,000 |
| Sample 2 | 3,000 | 1,000 |
| Sample 3 | 9,000 | 7,000 |
| Sample 4 | 14,000 | 12,000 |
| Sample 5 | 48,000 | 44,000 |

Using the above samples, their reliability was evaluated on various items as described below.

(Initial visual appearance)

Any faulty fill of the solar cell module (finished form) and any flaws on the solar cell surface were examined to evaluate visual appearance at the initial stage. At the same time, evaluation was also made on beauty as construction materials and roofing materials, of the solar cell module having been worked.

The results of evaluation are shown in Table 2 on the basis of the following evaluation criteria.

AA: An instance where the solar cell module has no defects in visual appearance and also has a beauty as construction materials and roofing materials.

A: An instance where the solar cell module has defects more or less in visual appearance but has no problem in practical use.

C: An instance where the solar cell module has a faulty fill and flaws on the surface seriously or has caused damage to the beauty as construction materials and roofing materials.

Any other matters noticed are noted below additionally.

(High-temperature high-humidity test)

Each solar cell module was put in an environment of 85° C./85%RH for 3000 hours, and thereafter the solar cell module was taken out, where its conversion efficiency was measured under light irradiation of AM 1.5, 100 mW/cm$^2$ to determine the rate of change from the initial value before testing.

The results of evaluation are shown in Table 2 on the bases of the following evaluation criteria.

AA: An instance where the change in conversion efficiency is less than 1.0%.

A: An instance where the change in conversion efficiency is from 1.0% to less than 3.0%.

B: An instance where the change in conversion efficiency is from 3.0% to less than 5.0%.

C: An instance where the change in conversion efficiency is 5.0% or more.

(Temperature-humidity cycle test)

Each solar cell module was put repeatedly to a temperature-humidity cycle test of −40° C./0.5 hour:85° C./85%RH/20 hours 100 times, and thereafter the solar cell module was taken out, where its conversion efficiency was measured under light irradiation of AM 1.5, 100 mW/cm$^2$ to determine the rate of change from the initial value before testing.

The results of evaluation are shown in Table 2 on the basis of the following evaluation criteria.

AA: An instance where the change in conversion efficiency is less than 1.0%.

A: An instance where the change in conversion efficiency is from 1.0% to less than 3.0%.
B: An instance where the change in conversion efficiency is from 3.0% to less than 5.0%.
C: An instance where the change in conversion efficiency is 5.0% or more.

(Forward bias high-temperature high-humidity test)

Each solar cell module was put in an environment of 85° C./85%RH. Here, the inside environment of the tester was light-screened or the light-receiving side of the specimen was light-screened, to make the light not incident on the specimen. In such environment, wiring was so provided that an optimum operating voltage was applicable in the forward direction of an internal PV circuit (diode component), and a voltage was applied for 2,000 hours. Thereafter, the solar cell module was taken out, and low-illumination Voc (open-circuit voltage Voc under illumination of 200 lux) was measured for each cell of photovoltaic device to determine the rate of change from the initial value before testing. A decrease in low-illumination Voc indicates a decrease in shunt resistance that is caused by junction defects on the interior of the photovoltaic device.

The results of evaluation are shown in Table 2 on the basis of the following evaluation criteria.

AA: An instance where the change in low-illumination Voc is less than 1.0%.
A: An instance where the change in low-illumination Voc is from 1.0% to less than 3.0%.
B: An instance where the change in low-illumination Voc is from 3.0% to less than 5.0%.
C: An instance where the change in low-illumination Voc is 5.0% or more.

(Backward bias high-temperature high-humidity test)

Each solar cell module was put in an environment of 85° C./85%RH. Here, the inside environment of the tester was light-screened or the light-receiving side of the specimen was light-screened, to make the light not incident on the specimen. In such environment, wiring was so provided that a bypass diode operating voltage (Vf) was applicable in the backward direction of an internal PV circuit (diode component), and a voltage was applied for 2,000 hours. Thereafter, the solar cell module was taken out, and low-illumination Voc (open-circuit voltage Voc under illumination of 200 lux) was measured for each cell of photovoltaic device to determine the rate of change from the initial value before testing. A decrease in low-illumination Voc indicates a decrease in shunt resistance that is caused by junction defects on the interior of the photovoltaic device.

The results of evaluation are shown in Table 2 on the basis of the following evaluation criteria.

AA: An instance where the change in low-illumination Voc is less than 1.0%.
A: An instance where the change in low-illumination Voc is from 1.0% to less than 3.0%.
B: An instance where the change in low-illumination Voc is from 3.0% to less than 5.0%.
C: An instance where the change in low-illumination Voc is 5.0% or more.

(Outdoor weathering test)

Each solar cell module was set outdoors (an outdoor weathering test station of c/o CANON INC. Ecology Research Institute, 1-1, Kizugawadai 4-chome, Kizu-machi, Souraku-gun, Kyoto-fu), and evaluation was made 12 months later. Low-illumination Voc (open-circuit voltage Voc under illumination of 200 lux) was measured for each cell of photovoltaic device to determine the rate of change from the initial value before testing.

The results of evaluation are shown in Table 2 on the basis of the following evaluation criteria.

AA: An instance where the change in low-illumination Voc is less than 1.0%.
A: An instance where the change in low-illumination Voc is from 1.0% to less than 3.0%.
B: An instance where the change in low-illumination Voc is from 3.0% to less than 5.0%.
C: An instance where the change in low-illumination Voc is 5.0% or more.

(Observation by SEM)

A place seemed to have the greatest strain in the solar cell module was cut out, and was observed by scanning electron microscopy (SEM).

The results of evaluation are shown in Table 2 on the basis of the following evaluation criteria.

AA: An instance where no cracks are seen on the surface of the photovoltaic device.
C: An instance where cracks are seen on the surface of the photovoltaic device.

The solar cell modules were tested on the above items to obtain the results shown below.

Table 2 shows the results of various reliability tests in Experiment 2.

TABLE 2

| Sample: | Initial visual appearance | High temp. high humidity test | Temp. humidity cycle test | Forward bias high temp. high humidity test | Backward bias high temp. high humidity test | Outdoor weathering test | SEM observation |
|---|---|---|---|---|---|---|---|
| 1 | AA | AA | AA | AA | AA | AA | AA |
| 2 | A | AA | AA | AA | AA | AA | AA |
| 3 | AA | A | A | B | B | C | C |
| 4 | A | A | A | C | C | C | C |
| 5 | C | B | B | C | C | C | C |

The solar cell module of Sample 1 shows good results on the initial visual appearance and also on the visual appearance after the high-temperature high-humidity test and temperature-humidity cycle test.

The solar cell module of Sample 2 was made to have a small residual strain of 1,000 με, and hence impresses us as being worked a little not well in the initial visual appearance, but on the level not problematic.

In view of electrical properties, too, there occurs no decrease in low-illumination Voc in the forward and backward bias high-temperature high-humidity tests. No lowering of performance is seen also as a result of the 12-month outdoor weathering. No cracks were seen upon SEM observation of the photovoltaic device surface of the solar cell module. Thus, a highly reliable solar cell module was able to be produced.

The solar cell module of Sample 3 had a peak strain of 9,000 με at the time of working and a residual strain of 7,000

µε, and cracks were seen in its observation by SEM. This is considered due to the photovoltaic device having once received the strain of 9,000 µε at the time of working, at the stage of which cracks have occurred. As a result of the forward and backward bias tests of this sample, the low-illumination Voc has decreased after about 1,500 hours. In the outdoor weathering, too, the low-illumination Voc has began to decrease gradually after weathering for about 6 months.

The solar cell module of Sample 4 had a peak strain of 14,000 µε at the time of working and a residual strain of 12,000 µε, and many cracks were seen in its observation by SEM. In the forward bias high-temperature high-humidity storage and backward bias high-temperature high-humidity storage tests, the low-illumination Voc has decreased after about 1,200 hours. In the outdoor weathering, too, the low-illumination Voc has decreased after weathering for about 3 months. Not shown in Table 2, in its visual appearance after the high-temperature high-humidity test and temperature-humidity cycle test, the filler has become a little turbid, though on the level not problematic.

The solar cell module of Sample 5 had a peak strain of 4,800 µε at the time of working and a residual strain of 4,400 µε, and was seen to have caused changes in initial visual appearance (change in color) on the photovoltaic device in its visual observation. In the observation by SEM, too, very many cracks were seen of course. In the forward bias high-temperature high-humidity storage and backward bias high-temperature high-humidity storage tests, the low-illumination Voc has began to decrease after less than 1,000 hours, showing no inconsistency with the results of observation of cracks. Not shown in Table 2, in visual appearance of the filler, too, the filler has been seen to have become turbid from the beginning at its worked portions. This becomes more conspicuous after the high-temperature high-humidity test and temperature-humidity cycle test, and hence comes into question about the beauty as roofing materials.

Namely, good results are shown in the evaluation of reliability on all items when the photovoltaic device is deformed at less than the F.F.-drop critical value, i.e., in this instance, at a peak strain less than 7,000 µε.

(Conclusions from Experiments 1 and 2)

The photovoltaic devices worked at a strain less than the F.F.-drop critical value caused no lowering of performance as a result of working, and the reliability of solar cell modules making use of them was also ensured. Then, in the SEM observation of these photovoltaic devices, cracks were seen on those worked at a strain not less than the F.F.-drop critical value.

That is, the present inventors have had findings that solar cell modules that may cause no lowering of initial performance of solar cells and also can ensure long-term reliability can be obtained when the photovoltaic device is worked at a strain less than the F.F.-drop critical value.

In order to ascertain the deformable region of the photovoltaic device, having a higher long-term reliability, the present inventors made further studies.

The drop of F.F. is considered to be caused by cracks occurring in the photovoltaic device, where the amount of drop in the drop of F.F. depends on the size and number of the cracks, thus it is presumed that the F.F. does not drop so long as the cracks are minute.

Cracks increase with an increase in strain, and the F.F. drops at the strain not less than the F.F.-drop critical value. With a further increase in cracks, the F.F. drops greatly in the manner corresponding thereto, as is also clear from Experiment 1.

The present inventors have continued to make studies while taking note of a point "there is a possibility that cracks may have occurred even in photovoltaic devices worked at a strain less than the F.F.-drop critical value". As the result, they have reached the following conclusion.

What is most important as a factor that affect the electrical properties and long-term reliability of photovoltaic devices when worked to deform them is the presence or absence of cracks in the photovoltaic devices, and the deformable region of the photovoltaic device, which can ensure a higher long-term reliability, can be provided if its cracking critical value can be made clear (i.e., defined).

There is also a possibility that scatterings in conditions for film formation in the manufacture of photovoltaic devices bring about scatterings in layer thickness of the layers constituting the photovoltaic devices to make the cracking critical value differ. The deformable region of the photovoltaic device, having a tolerance, must be made clear or defined also taking account of such scatterings.

Then, based upon the foregoing, they have made Experiment 3.

[Experiment 3]

This experiment intends to clarify or define the cracking critical value of a photovoltaic device when a tensile strain is applied to the photovoltaic device, and also clarify or define the deformable region of the photovoltaic device, taking account of also the scatterings in thickness of the layers constituting the photovoltaic device, by the use of samples prepared in a large number taking account of actual manufacture.

As the samples, the same photovoltaic devices as those used in Experiment 1 were used, provided that, since this time the electrical properties were not measured, the experiment was made in such a state that the collector electrode was not formed on the transparent conductive layer. A strain gauge was stuck to the back of the photovoltaic device in the same manner as in Experiment 1, and the desired strain was applied by means of a tensile tester. Thereafter, the surface of the photovoltaic device was observed by SEM to examine cracks having occurred in the light-activated layer.

Figure 9:
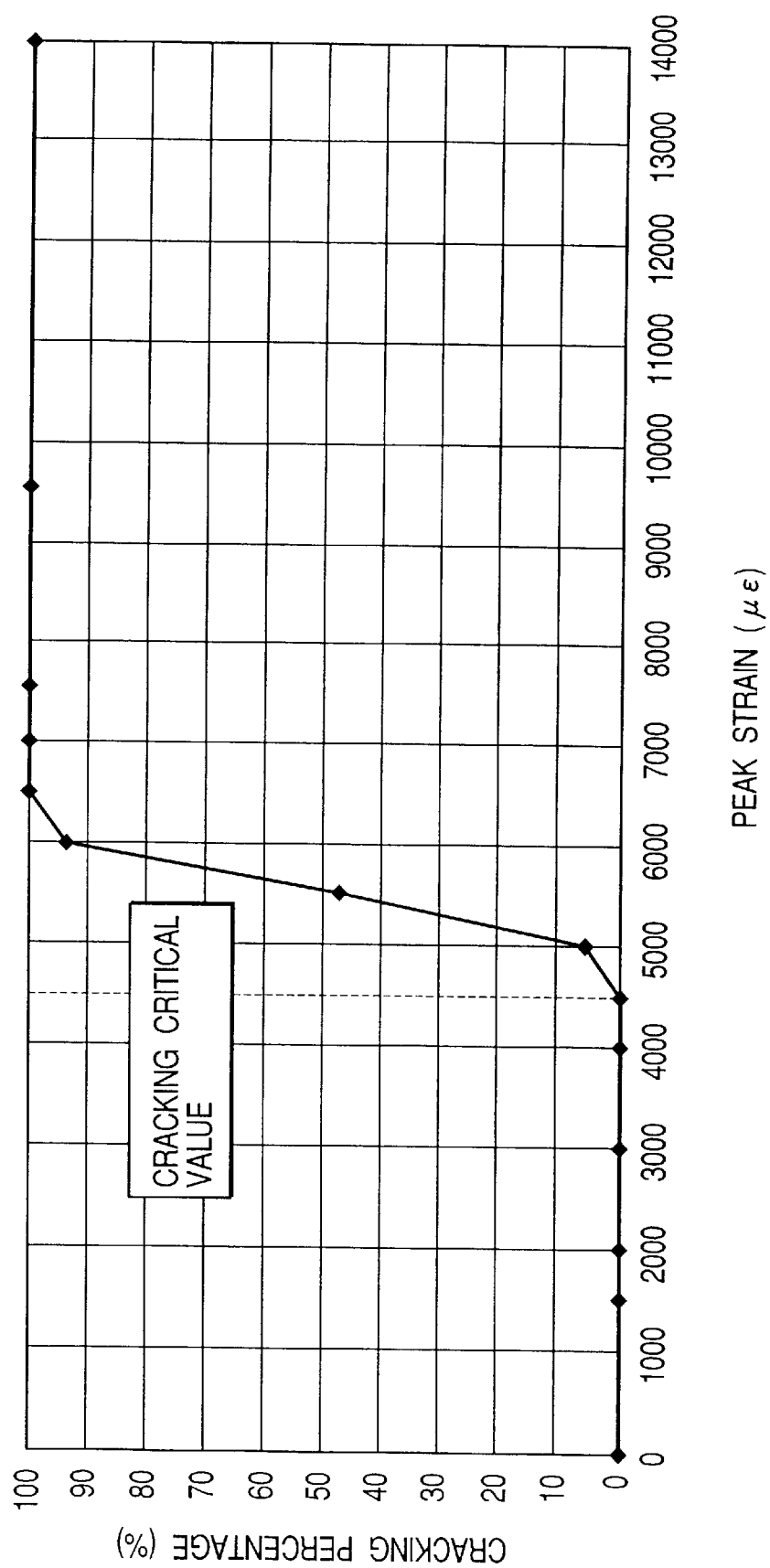
FIG. 9 is a graph showing an example of the relationship between peak strain and cracking percentage.

FIG. 9 is a graph showing an example of the relationship between peak strain and cracking percentage in the photovoltaic devices of Experiment 3. Strain (µε) is plotted as abscissa, and cracking percentage (%) as ordinate. The graph also implies the results of SEM observation in Experiments 1 and 2.

The following has been found from the results.

(1) When a strain is applied to the photovoltaic device, its application to a certain strain or more causes a possibility of cracking. This strain is defined as the cracking critical value. In the amorphous silicon photovoltaic devices of the present Experiment, the cracking critical value is 4,500 µε.

(2) Scatterings in photovoltaic device samples are accompanied by scatterings in cracking. In the amorphous silicon photovoltaic devices of the present Experiment, some samples have caused cracking at a strain of from 4,500 µε to 6,500 µε, and some samples have not at such strain. This is considered due to scatterings in layer thickness or film-forming conditions of the layers constituting the photovoltaic devices.

(3) When a strain is further applied to the photovoltaic device, its application to a certain strain or more always causes cracking. In the amorphous silicon photovoltaic devices of the present Experiment, the cracking occurs by 100% at a strain of 6,500 µε or more.

[Specific Embodiments]

Figure 10A:
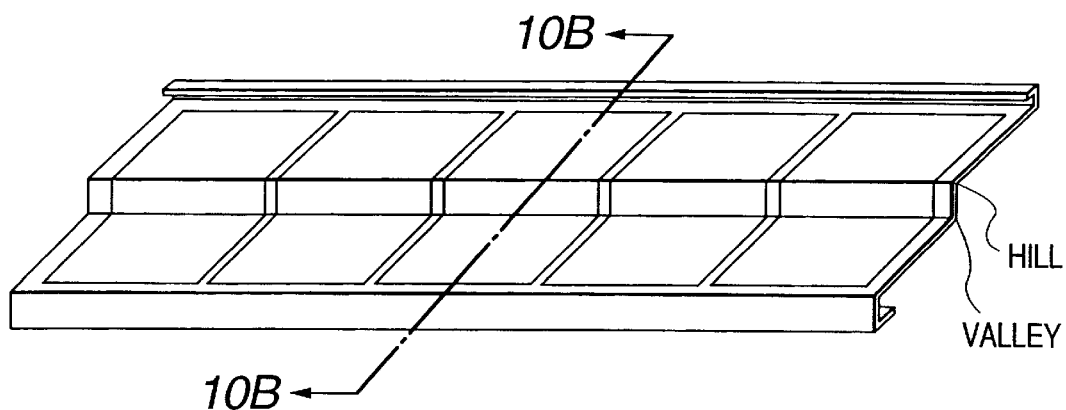
Figure 10B:
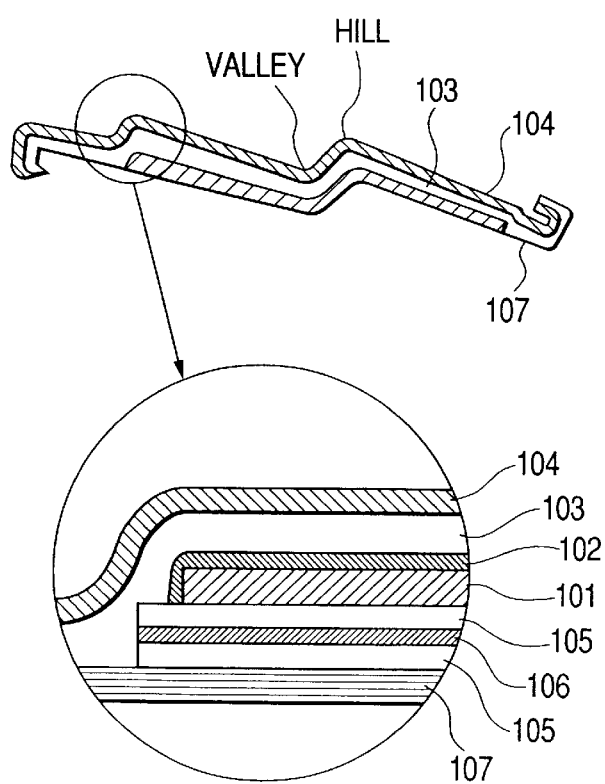

FIGS. 10A and 10B are a diagrammatic perspective view and a diagrammatic cross-sectional view, respectively, of an example of a solar cell module that typifies the present invention. In FIGS. 10A and 10B, reference numeral 101 denotes a photovoltaic device (a cell block is hereinafter often called in this way); 102, a surface-protection reinforcing material; 103 and 105, fillers, 104, a surface protective material; 106, a back protective material; and 107, a reinforcing material. The light from the outside, such as sunlight, is incident through the surface protective material 104 and reaches the photovoltaic device 101 to generate electricity. The electricity thus generated is taken out to the outside through an output terminal (not shown). The photovoltaic device 101 is characterized in that it has been worked by bending to form a hill and a valley and have a strain, and the strain is not more than the cracking critical value.

How to form and work the solar cell module constituted as described above will be described below. A flat solar cell module to which the reinforcing material has been stuck is prepared first, and thereafter worked by bending in the manner as shown in FIGS. 10A and 10B.

In the solar cell module shown in FIGS. 10A and 10B, it is worked by bending into a stair (or terrace) at the middle of the photovoltaic device 101. In this working, the place where the strain is produced is the hill (or edge) and valley of the stair-like portion. In particular, the place where the greatest strain is produced is the hill of the stair-like portion. The strain is also produced at the valley but very slightly. The strain extends up to the photovoltaic device 101. In this way, the module is worked at the desired position without regard to whether or not the photovoltaic device 101 lies there. Here, the photovoltaic device 101 is worked at a strain not more than the cracking critical value.

FIGS. 10A and 10B show an example in which the module is worked into a stair, but not limited thereto. It may be worked into a wave so as to be shaped as if it is a roofing tile. A shape projected in a triangle is also possible. Alternatively, the module may be so worked that it is provided with a bent portion only partly, it has a large number of concavo-convex portions, or a flat solar cell module is tensile-stressed as it is. A large-size solar cell module like the one shown in FIGS. 10A and 10B may be worked as a stair-shaped roofing material having a narrow working width.

So long as the module is worked within the range in which the photovoltaic device is deformed at a strain not more than the cracking critical value and also worked to cause the reinforcing material undergo plastic deformation, it is possible for the module to retain the shape and strain also after it has been worked. Also, in the case of the solar cell module having no reinforcing material, the flexible substrate of the photovoltaic device may be caused to undergo plastic deformation to make it possible for the solar cell module to retain the shape and strain.

On the reinforcing material at its part where the photovoltaic device dose not lie, it becomes possible to work the reinforcing material at a great strain, whereby the module can be so worked that the whole reinforcing material can maintain its shape. This can make the module have the function as a roofing material or the function as a construction material, thus a solar cell module can be provided which has both superior reliability and superior beauty as a construction material integral type solar cell module.

(Strain)

The strain referred to in the present invention is one expressed as the value that represents the amount of displacement produced when a certain substance is deformed. In particular, it refers to a strain produced in a photovoltaic device when the photovoltaic device is worked to deform. Strain $\epsilon$ produced when, e.g., a material having a length L is elongated by $\Delta L$ is expressed by:

$$\epsilon = \Delta L / L.$$

As its unit, it is expressed as % or $\mu\epsilon$. Usually, elongation by 1% is expressed as 10,000 $\mu\epsilon$.

(Cracking critical value)

The cracks referred to in the present invention are cracks occurring in the light-activated layer of the photovoltaic device, which occur when the light-activated layer is deformed beyond a tolerance limit of deformation at the time of the deformation of the photovoltaic device. The photovoltaic device is a multi-layer member comprising a plurality of layers, and has a possibility of cracking caused by cracks occurring in the layer(s) other than the light-activated layer. The cracking critical value is the critical value of strain at which the cracks occur, and, as a matter of course, it may differ depending on the materials forming the photovoltaic device, its constitution, its thickness and so forth.

(Strain holding means)

The strain holding means in the present invention is a means by which the shape and strain given by working the solar cell module to make it have a good design and the function as a roofing material are retained also after it has been worked. There are no particular limitations on such a means. It may preferably comprise a worked portion formed by causing the reinforcing material of the solar cell module to undergo plastic deformation or, in the case of the solar cell module having no reinforcing material, by causing the flexible substrate to undergo plastic deformation.

Constituent materials used in the present invention will be described below in detail.

(Photovoltaic device)

As the photovoltaic device in the present invention, it is preferable to use the one constituted as shown in FIGS. 2A to 2C.

As the flexible substrate 201, a metal or resin may be used. Its surface may have a fine unevenness. A transparent material may be used so that the light can be incident on the side of the flexible substrate 201. When, however, amorphous silicon is used as the light-activated layer, the metal or resin may preferably be used also in order to make the most of its flexibility. The metal or resin may have a continuous form so that it can be adapted to continuous film formation. A resin substrate may be made of a material including polyethylene terephthalate, polyethylene naphthalate, aromatic polyester, aromatic polyamide, polysulfonic acid, polyimide, polyarylate and polyether ketone. The substrate may also preferably comprise a conductive substrate since it not only can serve as the substrate of the photovoltaic device but also can play a role as a lower electrode. Such a conductive substrate may be made of a material including silicon, tantalum, molybdenum, tungsten, stainless steel, aluminum, copper, titanium, carbon sheet, terneplate, and resin film on which a conductive layer has been formed.

The back reflective layer 202 may be formed using a metal or a metal oxide, or a metal and a metal oxide in combination. The back reflective layer 202 plays a role as a reflective layer which reflects the light having reached the substrate, so as to be again utilized in the light-activated layer 203. Its surface may be made uneven so that the reflected light can have an extended optical-path in the light-activated layer 203 to act to amplify electric currents. As the metal, it may include, e.g., Ti, Cr, Mo, W, Al, Ag, Ni, Cu and Au. As the metal oxide, it may include, e.g., ZnO, $TiO_2$ and $SnO_2$. The back reflective layer 202 may be formed by a process such as resistance heating vacuum deposition, electron beam vacuum deposition, sputtering, plating or printing.

The light-activated layer 203 is the part that effects photoelectric conversion. Specific materials therefor may include p-n junction type polycrystalline silicon, p-i-n junction type amorphous silicon, and compound semiconductors including $CuInSe_2$, $CuInS_2$, GaAs, $CdS/Cu_2S$, CdS/CdTe, CdS/InP and $CdTe/Cu_2Te$. In the case of the polycrystalline silicone, the light-activated layer 203 may be formed by a process in which fused silicon is formed into a sheet or noncrystalline silicon is treated by heat; in the case of the amorphous silicon, by a process such as microwave plasma CVD (chemical vapor deposition) or high-frequency plasma CVD carried out using a silane gas as a material; and in the case of the compound semiconductor, by a process such as ion plating, ion beam deposition, vacuum deposition, sputtering or electodeposition.

The transparent conductive layer 204 plays a role as a surface electrode of the photovoltaic device. At the same time, it brings the incident light and reflected light into greatly irregular reflection to extend the optical-path length in the light-activated layer 203. Moreover, since it has a resistance, it can prevent the light-activated layer 203 from short-circuiting due to defects such as pinholes. It may preferably have a resistivity of from $10E^{-8}$ ($\Omega \cdot cm$) to $10E^{-1}$ ($\Omega \cdot cm$). Materials used may include, e.g., $In_2O_3$, $SnO_2$, $In_2O_3$—$SnO_2$ (ITO), ZnO, $TiO_2$, $Cd_2SnO_4$, and a high-density impurity-doped crystalline light-activated layer 203. The transparent conductive layer 204 may be formed by a process such as resistance heating vacuum deposition, sputtering, spraying, CVD or impurity diffusion.

The collector electrode 205 plays a role as a collector to take up the electricity generated in the light-activated layer 203, in a good efficiency through the transparent conductive layer 204, and may be provided in the form of a grid, having the shape of a grating. As specific materials for the collector electrode 205, it may include, e.g., Ti, Cr, Mo, W, Al, Ag, Ni, Cu, Sn, and conductive pastes including silver paste. The collector electrode 205, may be formed by a process such as sputtering, resistance heating or CVD which makes use of a mask, a process in which a metal film is vacuum-deposited and thereafter its unnecessary areas are removed by etching to effect patterning, a process in which a grid electrode pattern is formed directly by photo-assisted CVD, a process in which a mask having a negative pattern of a grid electrode pattern is formed, followed by plating, and a process in which a conductive paste is printed. As the conductive paste, a paste prepared by dispersing fine powder of silver, gold, copper, nickel or carbon in a binder polymer may be used in usual cases. The binder polymer may include, e.g., polyester, epoxy, acrylic, alkyd, polyvinyl acetate, rubber, urethane and phenol resins. Taking account of mass productivity, the collector electrode may preferably be formed by heat contact bonding of a copper wire coated with the conductive paste.

Finally, in order to take out the electricity generated, the positive-pole output terminal 207 is attached to the collector electrode 205 and the negative-pole output terminal 206 to the conductive flexible substrate 201. The negative-pole output terminal 206 may be attached by joining a metal member such as a copper tab by spot welding or soldering, and the positive-pole output terminal 207 may be attached by connecting a metal member electrically to the collector electrode 205 using a conductive paste or solder. When the collector electrode 205 is formed using the wire coated with the conductive paste, it can be attached by heat contact bonding, which can be carried out simultaneously when the collector electrode 205 is formed, bringing about a high productivity. The insulating material 208 may preferably be provided in order to prevent the positive-pole output terminal 207 from coming into contact with the conductive flexible substrate 201 or light-activated layer 203 to cause a short circuit.

(Reinforcing material)

The reinforcing material has a role as a material to make the solar cell module have a higher mechanical strength and to prevent it from straining and warping because of temperature changes. To set up a roofing material integral type solar cell module, the reinforcing material must have a function as a roofing material and must form a joint between roofing materials. Also, in order to improve its design as the roofing material, it must be worked into the shape of any roofing material. The reinforcing material is feasible for such working, as an additional role. As materials therefor, preferred are, e.g., sheets of iron, stainless steel or aluminum, galvanized steel sheets coated with an organic high-polymer resin having good weatherability and rust resistance, plastic sheets, and FRP (fiber glass reinforced plastic).

(Back protective material)

The back protective material is necessary for keeping electrical insulation between the photovoltaic device and the conductive reinforcing material. As materials therefor, preferred are materials which can ensure a sufficient electrical insulation, also have a long-term durability, and are flexible enough to withstand thermal expansion and thermal constriction. Films are preferably usable which may include nylon, polyethylene terephthalate and polycarbonate films.

(Filler)

The filler is positioned on the surface side (light-receiving side) and back side of the photovoltaic device. The filler on the surface side plays a role as a material to make adhesion between the photovoltaic device and the surface protective material. The filler on the back side plays a role as a material to make adhesion between the photovoltaic device and the back protective material and between the back protective material and the reinforcing material. It is also necessary for filling and covering the unevenness of photovoltaic devices and protecting the photovoltaic devices from severe external factors such as temperature changes, humidity and impact. Accordingly, it is required to have weatherability, adhesive properties, filling properties, heat resistance, cold resistance and impact resistance. Materials that meet these requirements may include resins as exemplified by polyolefin resins such as an ethylene-vinyl acetate copolymer (EVA), an ethylene-methyl acrylate copolymer (EMA), an ethylene-ethyl acrylate copolymer (EEA) and polyvinyl butyral resin, urethane resins and silicone resins. In particular, EVA has physical properties well balanced for its use in solar cells, and is used preferably.

(Surface-protection reinforcing material)

The surface-protection reinforcing material stands soaked in the surface-side filler, and plays a role as a material to improve resistance to flaws which are caused externally. In the step of lamination to finish the solar cell module by heating in vacuum in a pressed state, the air remaining in the solar cell module must be removed. This surface-protection reinforcing material can provide air channels for such purpose, as an additional role. Materials therefor may specifically include glass fiber nonwoven fabric, glass fiber woven fabric and glass fillers. In particular, it is preferred to use glass fiber nonwoven fabric. Glass fiber woven fabric is expensive and can soak in the filler resin with difficulty. Use of glass fillers does not bring about improvement in scratch resistance so much.

In order to ensure a sufficient adhesion in relation to long-term service, the surface-protection reinforcing material may preferably be treated beforehand with a silane coupling agent or an organic titanate compound.

(Surface protective material)

The surface protective material is positioned as the outermost layer of the solar cell module, and hence is required to have the performance to ensure the long-term reliability in outdoor weathering of the photovoltaic device, including weatherability, stain resistance and mechanical strength. Materials therefor may include fluorine resins and acrylic resins. In particular, fluorine resins may preferably be used because of their superior weatherability and stain resistance. Stated specifically, they include polyvinylidene fluoride resin, polyvinyl fluoride resin, and tetrafluoroethylene-ethylene copolymer. In view of weatherability, polyvinylidene fluoride resin is advantageous. In view of achievement of both weatherability and mechanical strength and transparency, tetrafluoroethylene-ethylene copolymer is advantageous. In order to improve adhesion to the filler, the surface protective layer may preferably be subjected to surface treatment such as corona treatment, plasma treatment, ozone treatment, UV irradiation, electron-ray irradiation or flame treatment.

EXAMPLES

The present invention will be described below in greater detail with reference to drawings. The present invention is by no means limited to these Examples.

Example 1

Figure 11:
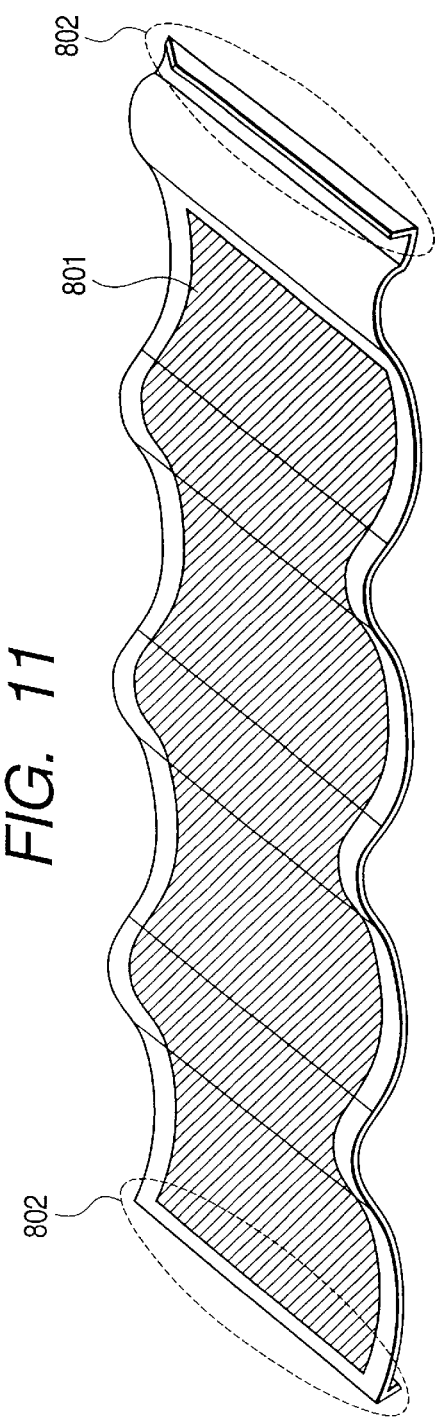
FIG. 11, FIG. 12 and FIG. 13 are diagrammatic perspective views to show other examples of solar cell modules.

FIG. 11 is a diagrammatic perspective view of a solar cell module of Example 1. The present Example is a corrugated roofing material integral type solar cell module. A photovoltaic device (cell block) 801 had a strain partly, which was not more than the cracking critical value at every part.

To produce this module, first a flat solar cell module was prepared in the same manner as that described in Experiment 1. Thereafter, the flat solar cell module was worked so as to be shaped as shown in FIG. 11.

Seam portions 802 at the edges of the solar cell module, which have the function to fit with those of adjoining modules to fix them each other as roofing materials, were worked by means of a bending machine. The whole corrugated shape was formed by working by means of a press molding machine. In either working, the reinforcing material of the solar cell module was caused to undergo plastic deformation so that its shape and strain were retained.

This solar cell module was able to attain good results concerning the reliability evalution on various items described previously.

Example 2

Figure 12:
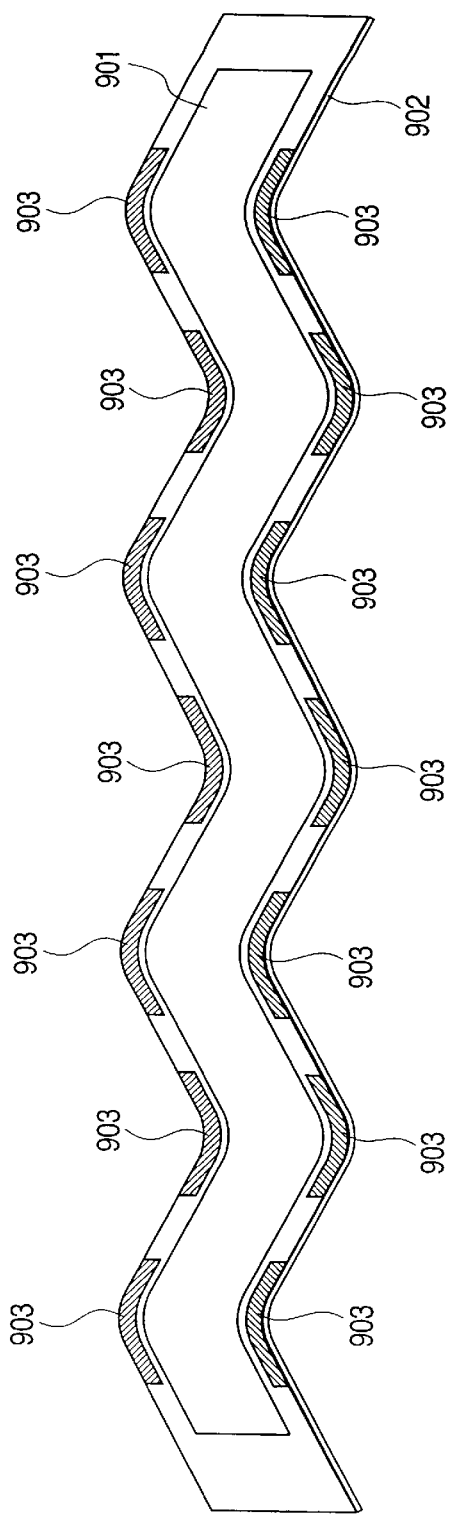

FIG. 12 is a diagrammatic perspective view of a solar cell module of Example 2. The present Example is a stair type solar cell module. A photovoltaic device (cell block) 901 had a strain partly, which was not more than 4,500 $\mu\varepsilon$ at every part.

To produce this module, first a flat solar cell module was prepared in the same manner as that described in Experiment 2, where no reinforcing material was provided and a back protective material 902 comprising a resin film formed the back of the solar cell module. Thereafter, the flat solar cell module was worked so as to be shaped as shown in FIG. 12.

This solar cell module had no reinforcing material. Accordingly, the flexible substrate of the photovoltaic device 901 was caused to undergo plastic deformation so that its stair shape was able to be retained. A strain holding means 903 was provided at each part where no photovoltaic device lay. The strain holding means comprises, e.g., an aluminum sheet.

This solar cell module was able to attain good results concerning the reliability evalution on various items described previously. Good results were obtained also in reliability evolution on the various items which was made on samples prepared in a large number to make evaluation of solar cell modules made to have scatterings in layer thickness when the layers constituting the photovoltaic device were formed.

Comparative Example 1

Figure 13:
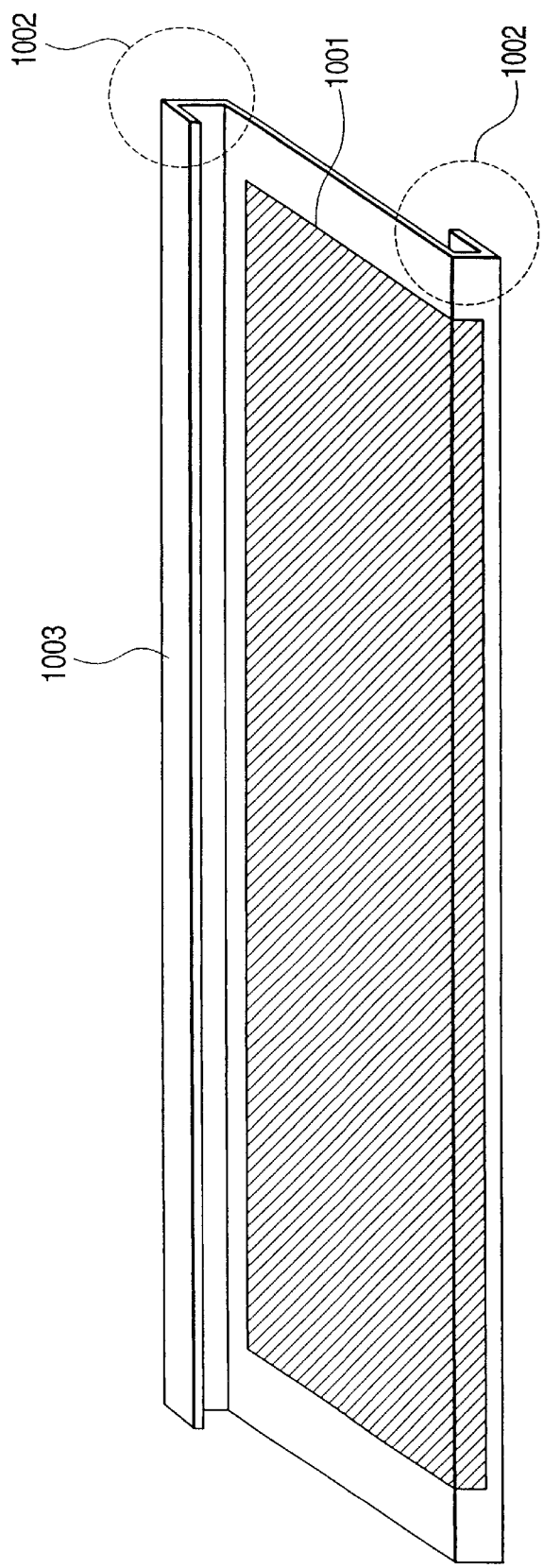

FIG. 13 is a diagrammatic perspective view of a solar cell module of Example 1. The present Comparative Example is a lateral roofing type roofing material integral type solar cell module. A photovoltaic device (cell block) 1001 had a strain partly, which strain was at the cracking critical value or more.

To produce this module, first a flat solar cell module was prepared in the same manner as that described in Experiment 2. Thereafter, the flat solar cell module was worked so as to be shaped as shown in FIG. 13.

U-turned portions 1002 at the edges of the solar cell module, which had the function to fit with those of adjoining modules to fix them each other as roofing materials, were worked by means of a roll-former machine. In this working, the reinforcing material 1003 of the solar cell module was caused to undergo plastic deformation so that its shape and strain were retained. However, since part of the photovoltaic device 1001 was positioned at one U-turned portion 1002, an extreme deformation has occurred at this part.

This solar cell module was not able to attain good results, in some cases, concerning the reliability evolution on various items described previously.

As described above, according to the present invention, the solar cell module of the present invention has a photovoltaic device provided on a flexible substrate, wherein (i) the photovoltaic device has a strain at least partly in the planar direction of the flexible substrate, (ii) the strain is set not more than the cracking critical value of the photovoltaic device cracks, and optionally (iii) the solar cell module may have the strain holding means for holding the strain. Thus, the deformable region of the photovoltaic device can be defined and hence a great variety of solar cell modules can be developed at a greatly higher speed. This also makes it possible to work the module freely in the region of the photovoltaic device, and hence to obtain a solar cell module that can give a superior beauty and design.

The solar cell module having been worked in the deformable region can be a solar cell module having ensured a high reliability over a long period of time.

The present invention can improve the workability of solar cell modules and can materialize construction material integral type solar cell modules having much superior beauty. Using such construction material integral type solar cell modules, solar electricity generation systems can be provided at a low cost.

What is claimed is:

1. A solar cell module comprising a photovoltaic device having a flexible substrate and a reinforcing material disposed on a non-light-receiving side of the photovoltaic device,
   wherein the photovoltaic device has a strain at least partly in the planar direction of the flexible substrate, the reinforcing material is plastically deformed, the strain is set at a value that is not more than the critical value at which the photovoltaic device cracks, and the device is held in its strained condition at least by the deformed reinforcing material, and
   wherein the critical value at which the photovoltaic device cracks is smaller than a F.F.-drop critical value and is from 4,500 $\mu\epsilon$ to 6,500 $\mu\epsilon$.

2. The solar cell module according to claim 1, wherein the strain is a strain in the tensile direction.

3. The solar cell module according to claim 1, wherein the flexible substrate is plastically deformed, and the device is held in its strained condition further by the deformed substrate.

4. The solar cell module according to claim 1, wherein the photovoltaic device has a light-activated layer, and the light-activated layer comprises a non-single-crystal semiconductor.

5. The solar cell module according to claim 1, wherein the flexible substrate is a conductive substrate.

6. The solar cell module according to claim 5, wherein the conductive substrate comprises stainless steel.

7. The solar cell module according to claim 1, wherein the flexible substrate comprises a resin film.

8. The solar cell module according to claim 1, wherein the reinforcing material comprises a metal.

9. The solar cell module according to claim 1, which further comprises a surface protective material, and the surface protective material comprises a transparent resin film.

10. The solar cell module according to claim 1, which further comprises a filler, and the filler comprises an organic-high-polymer resin.

11. The solar cell module according to claim 1, which further comprises a back protective material, and the back protective material comprises a transparent resin film.

12. The solar cell module according to claim 1, wherein the critical value at which the photovoltaic device cracks is 4,500 $\mu\epsilon$.

13. The solar cell module according to claim 3, wherein the strain is a tensile deformation of 2,000 $\mu\epsilon$ to 6,500 $\mu\epsilon$.

14. The solar cell module according to claim 1, wherein the reinforcing material's plastic deformation is in an area not embracing the photovoltaic device.

15. The solar cell module according to claim 1, wherein the solar cell module is integrated into a construction material.

16. A process for producing a solar cell module comprising a photovoltaic device having a flexible substrate and a reinforcing material disposed on a non-light-receiving side of the photovoltaic device, the process comprising:
   a working step of causing the photovoltaic device to have a strain at least partly in the planar direction of the flexible substrate, so that the reinforcing material is plastically deformed, the strain being set at a value that is not more than the critical value at which the photovoltaic device cracks, and the device is held in its strained condition at least by the deformed reinforcing material,
   wherein the critical value at which the photovoltaic device cracks is smaller than a F.F.-drop critical value and is from 4,500 $\mu\epsilon$ to 6,500 $\mu\epsilon$.

17. The process according to claim 16, wherein the strain is a strain in the tensile direction.

18. The process according to claim 16, wherein the flexible substrate is plastically deformed, and the device is held in its strained condition further by the deformed flexible substrate.

19. The process according to claim 16, wherein the photovoltaic device has a light-activated layer, and the light-activated layer comprises a non-single-crystal semiconductor.

20. The process according to claim 16, wherein the flexible substrate is a conductive substrate.

21. The process according to claim 20, wherein the conductive substrate comprises stainless steel.

22. The process according to claim 16, wherein the flexible substrate comprises a resin film.

23. The process according to claim 16, wherein the reinforcing material comprises a metal.

24. The process according to claim 16, wherein the solar cell module further comprises a surface protective material, and the surface protective material comprises a transparent resin film.

25. The process according to claim 16, wherein the solar cell module further comprises a filler, and the filler comprises an organic-high-polymer resin.

26. The process according to claim 16, wherein the solar cell module further comprises a back protective material, and the back protective material comprises a transparent resin film.

27. The process according to claim 16, wherein the critical value at which the photovoltaic device cracks is 4,500 $\mu\epsilon$.

28. The process according to claim 18, wherein the strain is a tensile deformation of 2,000 $\mu\epsilon$ to 6,500 $\mu\epsilon$.

29. The process according to claim 16, wherein the reinforcing material's plastic deformation is in an area not embracing the photovoltaic device.

30. The process according to claim 16, wherein the strain the photovoltaic device has is given by press molding.

31. The process according to claim 16, wherein the solar cell module is integrated into a construction material.

32. A solar cell module installing method comprising fixing the solar cell module according to claim 1 to an installation area by means of a fixing member.

33. A solar electricity generation system comprising the solar cell module according to claim 1 and an electric power conversion equipment for converting direct current to alternating current connected to the solar cell module.

34. A solar cell module comprising a photovoltaic device having a light-receiving side and a non-light-receiving side and a flexible substrate, wherein the photovoltaic device has a strain at least partly in the planar direction of the flexible substrate, the flexible substrate is plastically deformed, the strain is set at a value that is not more than the critical value at which the photovoltaic device cracks, and the device is held in its strained condition at least by the deformed flexible substrate, and
   wherein the critical value at which the photovoltaic device cracks is smaller than a F.F.-drop critical value and is from 4,500 $\mu\epsilon$ to 6,500 $\mu\epsilon$.

35. The solar cell module according to claim 34, wherein the solar cell module further comprises a metal sheet, and the metal sheet is disposed next to the photovoltaic device.

36. The solar cell module according to claim 34, wherein the strain is in the tensile direction.

37. The solar cell module according to claim 34, wherein the photovoltaic device has a light-activated layer, and the light-activated layer comprises a non-single-crystal semiconductor.

38. The solar cell module according to claim 34, wherein the flexible substrate is a conductive substrate.

39. The solar cell module according to claim 38, wherein the conductive substrate comprises stainless steel.

40. The solar cell module according to claim 34, which further comprises a surface protective material, and the surface protective material comprises a transparent resin film.

41. The solar cell module according to claim 34, which further comprises a filler, and the filler comprises an organic-high-polymer resin.

42. The solar cell module according to claim 34, which further comprises a back protective material, and the back protective material comprises a transparent resin film.

43. The solar cell module according to claim 34, wherein the critical value at which the photovoltaic device cracks is 4,500 $\mu\epsilon$.

44. The solar cell module according to claim 34, wherein the strain is a tensile deformation of 2,000 $\mu\epsilon$ to 6,500 $\mu\epsilon$.

45. The solar cell module according to claim 34, wherein the solar cell module is integrated into a construction material.

46. A process for producing a solar cell module comprising a photovoltaic device having a light-receiving side and a non-light-receiving side and a flexible substrate, the process comprising:

a working step of causing the photovoltaic device to have a strain at least partly in the planar direction of the flexible substrate, so that the flexible substrate is plastically deformed, the strain being set at a value that is not more than the critical value at which the photovoltaic device cracks, and the device is held in its strained condition at least by the deformed flexible substrate, wherein the critical value at which the photovoltaic device cracks is smaller than a F.F.-drop critical value and is from 4,500 $\mu\epsilon$ to 6,500 $\mu\epsilon$.

47. The process according to claim 46, wherein the strain is in the tensile direction.

48. The process according to claim 46, wherein the photovoltaic device has a light-activated layer, and the light-activated layer comprises a non-single-crystal semiconductor.

49. The process according to claim 46, wherein the flexible substrate is a conductive substrate.

50. The process according to claim 49, wherein the conductive substrate comprises stainless steel.

51. The process according to claim 46, wherein the solar cell module further comprises a surface protective material, and the surface protective material comprises a transparent resin film.

52. The process according to claim 46, wherein the solar cell module further comprises a filler, and the filler comprises an organic-high-polymer resin.

53. The process according to claim 46, wherein the solar cell module further comprises a back protective material, and the back protective material comprises a transparent resin film.

54. The process according to claim 46, wherein the critical value at which the photovoltaic device cracks is 4,500 $\mu\epsilon$.

55. The process according to claim 46, wherein the strain is a tensile deformation of 2,000 $\mu\epsilon$ to 6,500 $\mu\epsilon$.

56. The process according to claim 46, wherein the strain in the photovoltaic device is imparted by press molding.

57. The process according to claim 46, wherein the solar cell module is integrated into a construction material.

58. A solar cell module installing method comprising fixing the solar cell module according to claim 34 to an installation area by means of a fixing member.

59. A solar electricity generation system comprising the solar cell module according to claim 34 and an electric power conversion equipment for converting direct current to alternating current connected to the solar cell module.

60. A process for producing a solar cell module comprising a photovoltaic device having a flexible substrate, the process comprising the steps of:

coating the light-receiving side and the non-light-receiving side of the photovoltaic device with a resin; and plastically deforming the flexible substrate at a strain value that is not more than the critical value at which the photovoltaic device cracks, wherein the critical value at which the photovoltaic device cracks is smaller than a F.F.-drop critical value and is from 4,500 $\mu\epsilon$ to 6,500 $\mu\epsilon$.

61. A process for producing a solar cell module comprising a reinforcing material and a photovoltaic device having a flexible substrate, the process comprising the steps of:

superimposing the photovoltaic device and the reinforcing material;

coating the photovoltaic device and the reinforcing material with a resin; and bending the flexible substrate and the reinforcing material at a strain value that is not more than the critical value at which the photovoltaic device cracks, to plastically deform at least the reinforcing material, wherein the critical value at which the photovoltaic device cracks is smaller than a F.F.-drop critical value and is from 4,500 $\mu\epsilon$ to 6,500 $\mu\epsilon$.

62. A process for producing a solar cell module comprising a metal sheet and a photovoltaic device having a flexible substrate, the process comprising the steps of:

disposing the photovoltaic device and the metal sheet side by side;

coating the photovoltaic device and the metal sheet with a resin; and bending the flexible substrate and the metal sheet at a strain value that is not more than the critical value at which the photovoltaic device cracks, to plastically deform at least the metal sheet, wherein the critical value at which the photovoltaic device cracks is smaller than a F.F.-drop critical value and is from 4,500 $\mu\epsilon$ to 6,500 $\mu\epsilon$.

63. The process according to claim 62, wherein the metal sheet is disposed such that the metal sheet is along the longest dimension of the solar cell module.

* * * * *

UNITED STATES PATENT AND TRADEMARK OFFICE
CERTIFICATE OF CORRECTION

PATENT NO.     : 6,541,693 B2  
DATED          : April 1, 2003  
INVENTOR(S)    : Takeshi Takada et al.

It is certified that error appears in the above-identified patent and that said Letters Patent is hereby corrected as shown below:

<u>Title page,</u>  
Item [56], References Cited, FOREIGN PATENT DOCUMENTS,  
"JP      8-222752      *   8/1996" should be deleted.

<u>Column 1,</u>  
Line 18, "conceousness" should read -- consciousness --.

<u>Column 7,</u>  
Line 3, "uc-Si" should read -- $\mu$c-Si --.

Signed and Sealed this

Sixteenth Day of December, 2003

JAMES E. ROGAN  
*Director of the United States Patent and Trademark Office*